(12) United States Patent
Wang et al.

(10) Patent No.: US 8,293,558 B2
(45) Date of Patent: **\*Oct. 23, 2012**

(54) METHOD FOR RELEASING A THIN-FILM SUBSTRATE

(75) Inventors: David Xuan-Qi Wang, Fremont, CA (US); Mehrdad M. Moslehi, Los Altos, CA (US); Rafael Ricolcol, Fremont, CA (US); Joe Kramer, San Jose, CA (US)

(73) Assignee: Solexel, Inc., Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/719,766

(22) Filed: Mar. 8, 2010

(65) Prior Publication Data

US 2010/0279494 A1   Nov. 4, 2010

Related U.S. Application Data

(63) Continuation-in-part of application No. 12/473,811, filed on May 28, 2009, now Pat. No. 7,745,313, and a continuation-in-part of application No. 11/868,489, filed on Oct. 6, 2007.

(60) Provisional application No. 61/056,722, filed on May 28, 2008, provisional application No. 60/828,678, filed on Oct. 9, 2006, provisional application No. 61/158,223, filed on Mar. 6, 2009.

(51) Int. Cl.
*H01L 21/762* (2006.01)
*H01L 21/20* (2006.01)

(52) U.S. Cl. ....... 438/57; 438/59; 438/478; 257/E21.09; 257/E21.561

(58) Field of Classification Search .................... 438/57, 438/59, 478
See application file for complete search history.

(56) References Cited

U.S. PATENT DOCUMENTS

| | | |
|---|---|---|
| 4,043,894 A | 8/1977 | Gibbs |
| 4,070,206 A | 1/1978 | Kressel et al. |
| 4,082,570 A | 4/1978 | House et al. |
| 4,165,252 A | 8/1979 | Gibbs |
| 4,249,959 A | 2/1981 | Jebens |

(Continued)

FOREIGN PATENT DOCUMENTS

JP   06-260670 A   9/1994

(Continued)

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Alexander Ghyka
(74) *Attorney, Agent, or Firm* — Hulsey, P.C.; William N. Hulsey, III; John R. C. Wood

(57) ABSTRACT

The present disclosure relates to methods for selectively etching a porous semiconductor layer to separate a thin-film semiconductor substrate (TFSS) having planar or three-dimensional features from a corresponding semiconductor template. The method involves forming a conformal sacrificial porous semiconductor layer on a template. Next, a conformal thin film silicon substrate is formed on top of the porous silicon layer. The middle porous silicon layer is then selectively etched to separate the TFSS and semiconductor template. The disclosed advanced etching chemistries and etching methods achieve selective etching with minimal damage to the TFSS and template.

20 Claims, 24 Drawing Sheets

U.S. PATENT DOCUMENTS

| | | | |
|---|---|---|---|
| 4,251,679 A | 2/1981 | Zwan | |
| 4,348,254 A | 9/1982 | Lindmayer | |
| 4,361,950 A | 12/1982 | Amick | |
| 4,409,423 A | 10/1983 | Holt | |
| 4,427,839 A | 1/1984 | Hall | |
| 4,461,922 A | 7/1984 | Gay et al. | |
| 4,479,847 A | 10/1984 | McCaldin et al. | |
| 4,626,613 A | 12/1986 | Wenham et al. | |
| 4,672,023 A | 6/1987 | Leung | |
| 4,922,277 A | 5/1990 | Carlson | |
| 5,024,953 A | 6/1991 | Uematsu et al. | |
| 5,073,230 A | 12/1991 | Maracas et al. | |
| 5,112,453 A | 5/1992 | Behr et al. | |
| 5,208,068 A | 5/1993 | Davis | |
| 5,248,621 A | 9/1993 | Sano | |
| 5,316,593 A | 5/1994 | Olson et al. | |
| 5,348,618 A | 9/1994 | Canham et al. | |
| 5,397,400 A | 3/1995 | Matsuno et al. | |
| 5,459,099 A | 10/1995 | Hsu | |
| 5,494,832 A | 2/1996 | Lehmann et al. | |
| 5,538,564 A | 7/1996 | Kaschmitter | |
| 5,645,684 A | 7/1997 | Keller | |
| 5,660,680 A | 8/1997 | Keller | |
| 5,681,392 A | 10/1997 | Swain | |
| 5,882,988 A | 3/1999 | Haberern et al. | |
| 5,928,438 A | 7/1999 | Salami | |
| 6,058,945 A | 5/2000 | Fujiyama et al. | |
| 6,091,021 A | 7/2000 | Ruby | |
| 6,096,229 A | 8/2000 | Shahid | |
| 6,114,046 A | 9/2000 | Hanoka | |
| 6,127,623 A | 10/2000 | Nakamura et al. | |
| 6,187,216 B1* | 2/2001 | Dryer et al. | 216/95 |
| 6,204,443 B1 | 3/2001 | Kiso et al. | |
| 6,294,725 B1 | 9/2001 | Hirschberg et al. | |
| 6,331,208 B1 | 12/2001 | Nishida et al. | |
| 6,399,143 B1 | 6/2002 | Sun | |
| 6,416,647 B1 | 7/2002 | Dordi et al. | |
| 6,429,037 B1 | 8/2002 | Wenham et al. | |
| 6,441,297 B1 | 8/2002 | Keller et al. | |
| 6,448,155 B1 | 9/2002 | Iwasaki et al. | |
| 6,461,932 B1 | 10/2002 | Wang | |
| 6,524,880 B2 | 2/2003 | Moon et al. | |
| 6,534,336 B1 | 3/2003 | Iwane | |
| 6,555,443 B1 | 4/2003 | Artmann et al. | |
| 6,566,235 B2 | 5/2003 | Nishida et al. | |
| 6,602,760 B2 | 8/2003 | Poortmans et al. | |
| 6,602,767 B2 | 8/2003 | Nishida et al. | |
| 6,613,148 B1 | 9/2003 | Rasmussen | |
| 6,624,009 B1 | 9/2003 | Green et al. | |
| 6,645,833 B2* | 11/2003 | Brendel | 438/458 |
| 6,649,485 B2 | 11/2003 | Solanki et al. | |
| 6,653,209 B1* | 11/2003 | Yamagata | 438/459 |
| 6,653,722 B2 | 11/2003 | Blalock | |
| 6,664,169 B1 | 12/2003 | Iwasaki et al. | |
| 6,756,289 B1 | 6/2004 | Nakagawa et al. | |
| 6,881,644 B2 | 4/2005 | Malik et al. | |
| 6,946,052 B2 | 9/2005 | Yanagita et al. | |
| 6,964,732 B2 | 11/2005 | Solanki | |
| 7,022,585 B2 | 4/2006 | Solanki et al. | |
| 7,026,237 B2 | 4/2006 | Lamb | |
| 7,309,658 B2 | 12/2007 | Lazovsky et al. | |
| 7,368,756 B2 | 5/2008 | Bruhns et al. | |
| 7,402,523 B2 | 7/2008 | Nishimura | |
| 7,745,313 B2* | 6/2010 | Wang et al. | 438/479 |
| 2002/0153039 A1 | 10/2002 | Moon et al. | |
| 2002/0168592 A1 | 11/2002 | Vezenov | |
| 2002/0179140 A1 | 12/2002 | Toyomura | |
| 2003/0017712 A1 | 1/2003 | Brendel | |
| 2003/0039843 A1 | 2/2003 | Johnson | |
| 2003/0124761 A1 | 7/2003 | Baert | |
| 2004/0028875 A1 | 2/2004 | Van Rijn | |
| 2004/0173790 A1 | 9/2004 | Yeo | |
| 2004/0259335 A1 | 12/2004 | Narayanan | |
| 2004/0265587 A1 | 12/2004 | Koyanagi | |
| 2005/0160970 A1 | 7/2005 | Niira | |
| 2005/0172998 A1 | 8/2005 | Gee et al. | |
| 2005/0176164 A1 | 8/2005 | Gee et al. | |
| 2005/0177343 A1 | 8/2005 | Nagae | |
| 2005/0199279 A1 | 9/2005 | Yoshimine et al. | |
| 2005/0274410 A1 | 12/2005 | Yuuki et al. | |
| 2005/0281982 A1 | 12/2005 | Li | |
| 2006/0021565 A1 | 2/2006 | Zahler et al. | |
| 2006/0043495 A1 | 3/2006 | Uno | |
| 2006/0054212 A1 | 3/2006 | Fraas et al. | |
| 2006/0070884 A1 | 4/2006 | Momoi et al. | |
| 2006/0105492 A1 | 5/2006 | Veres et al. | |
| 2006/0177988 A1 | 8/2006 | Shea et al. | |
| 2006/0196536 A1 | 9/2006 | Fujioka | |
| 2006/0231031 A1 | 10/2006 | Dings et al. | |
| 2006/0266916 A1 | 11/2006 | Miller et al. | |
| 2006/0283495 A1 | 12/2006 | Gibson | |
| 2007/0007241 A1* | 1/2007 | DeLouise | 216/56 |
| 2007/0077770 A1 | 4/2007 | Wang et al. | |
| 2007/0082499 A1 | 4/2007 | Jung et al. | |
| 2008/0047601 A1 | 2/2008 | Nag et al. | |
| 2008/0157283 A1 | 7/2008 | Moslehi | |
| 2008/0210294 A1 | 9/2008 | Moslehi | |
| 2008/0264477 A1 | 10/2008 | Moslehi | |
| 2008/0289684 A1 | 11/2008 | Moslehi | |
| 2008/0295887 A1 | 12/2008 | Moslehi | |
| 2009/0042320 A1 | 2/2009 | Wang et al. | |
| 2009/0107545 A1 | 4/2009 | Moslehi | |
| 2009/0301549 A1 | 12/2009 | Moslehi | |
| 2010/0022074 A1 | 1/2010 | Wang et al. | |
| 2010/0116316 A1 | 5/2010 | Moslehi et al. | |

FOREIGN PATENT DOCUMENTS

| | | |
|---|---|---|
| JP | 2002-2299661 A | 10/2002 |
| WO | PCT/EP99/08573 | 11/1999 |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, 2005, Jul. 8, pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE.

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, May 13-17, 1996 Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (Seia) the Solar Energy Industry Association.

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

* cited by examiner

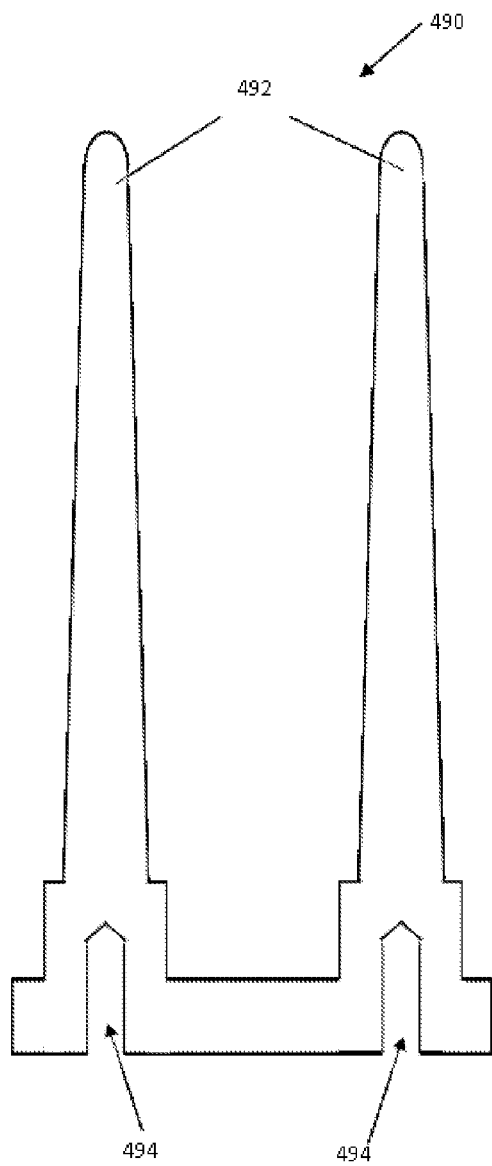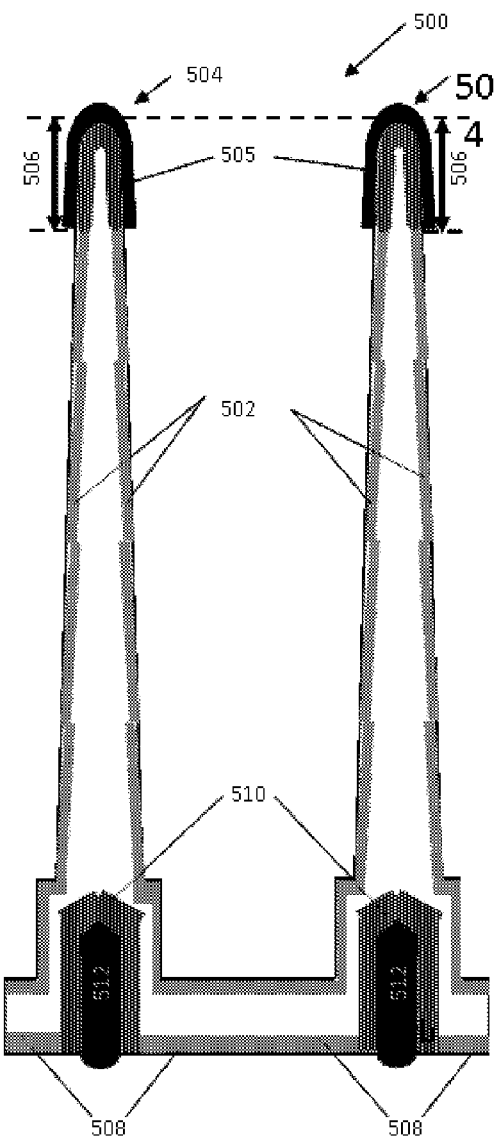
*FIGURE 24A*     *FIGURE 24B*

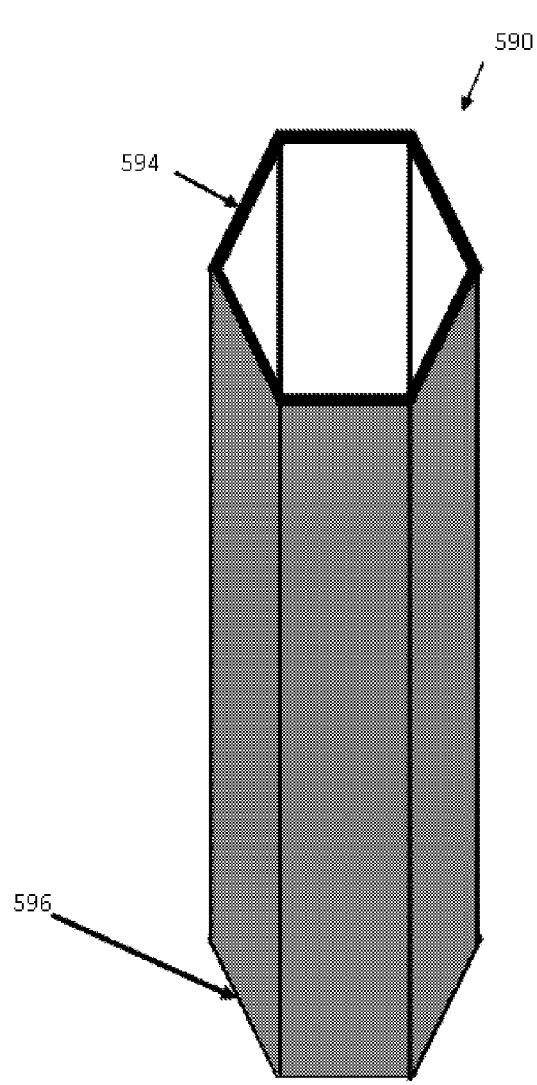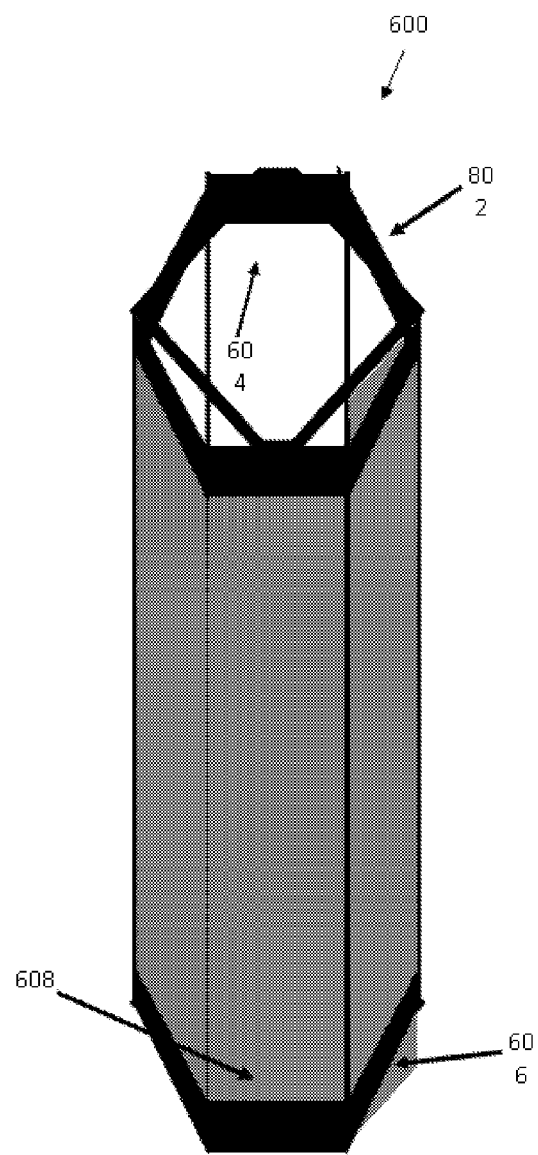
*FIGURE 30A*  *FIGURE 30B*

METHOD FOR RELEASING A THIN-FILM SUBSTRATE

CROSS-REFERENCE TO RELATED APPLICATIONS

This application claims priority to and is a continuation in part of pending U.S. patent application Ser. No. 12/473,811 "SUBSTRATE RELEASE METHODS AND APPARATUSES" by David Wang and filed on May 28, 2009, which is incorporated herein by reference in its entirety and made part of the present U.S. Utility Patent Application for all purposes.

This application claims priority to and is a continuation in part of pending U.S. patent application Ser. No. 11/868,489 "METHODS FOR MANUFACTURING THREE-DIMENSIONAL THIN-FILM SOLAR CELLS", (U.S. Patent Pub. No. 2008/0264477A1) by Mehrdad Moslehi and filed on Oct. 6, 2007, which is incorporated herein by reference in its entirety and made part of the present U.S. Utility Patent Application for all purposes.

This application also claims the benefit of provisional patent application 61/158,223 filed on Mar. 6, 2009, which is hereby incorporated by reference in its entirety made part of the present U.S. Utility Patent Application for all purposes.

FIELD

This disclosure relates in general to the field of semiconductors and photovoltaics, and more particularly to methods and apparatuses for releasing a thin-film silicon substrate (TFSS) from a reusable crystalline silicon template.

BACKGROUND OF THE INVENTION

In recent years, the need for clean, affordable energy sources has increased. Global concern over pollution created by fossil fuels, rising energy demands, and dwindling oil supplies require new and alternative sources of energy which are clean, cost-effective, environmentally-friendly, and widely available. Photovoltaics (PV), commonly known as solar cells, answer this need by converting electromagnetic radiation into electric energy through a phenomenon known as the photoelectric effect. Solar cells are an attractive solution to the current energy crisis because of the abundant supply of light, environmental friendliness, and scalability. However, current limitations stemming from production and manufacturing methods, limited efficiencies, and a lack of infrastructure limit solar cell use.

In order for solar cell technologies to gain a wider acceptance, the cost of energy ($/Kwh) for the end user must match or be lower than that of energy from utility grids produced by conventional energy sources such as coal. Counter-intuitively, increases in the efficiencies of solar cell modules often increase the cost of energy ($/Kwh) from those modules. Increased manufacturing complexity, increased material cost, and yield dominate the cost per module of high efficiency solar cells and limit their cost-effectiveness. Recent advances in the solar cell industry concentrate on reducing solar cell cost by decreasing material cost, use, and waste. Thin-film solar cell technologies employ these and other innovative production methods to reduce cost ($/Kwh) and increase commercial solar cell use. Further, new manufacturing methods create 3-D light trapping features, without an increase in complexity or waste, which increase solar cell efficiencies.

In the past, producing light trapping features employed photolithography and ineffective etching methods, resulting in increased manufacturing cost, complexity, time, and waste. Additionally, producing 3-D features on thin-film solar cells employing these methods reduces the mechanical strength of the solar cell and increases the likelihood of damage later in the manufacturing process.

Current etching processes used in the semiconductor and photovoltaic industries are inherently limited and are unsuited for producing cost-effective solar cells. Etching processes in use today produce 3-D features on a substrate by first coating that substrate with a material known as a photoresist. The etchant preferentially etches uncoated areas of the substrate. Thus, current etching processes are able to selectively etch surface layers of a semiconductor through the use of a photoresist.

However, this process is undesirable for many applications and a need exists for etching practices that can selectively etch middle layers of a semiconductor without damaging the outer layers, decrease etch time, and increase the selectivity of an etchant without using a photoresist. An enhanced selective etching process produces a sufficiently strong 3-D thin-film silicon substrate cost-effectively without damaging the reusable template used in the 3-D TFSS process.

U.S. patent application Ser. No. 11/868,489, entitled "METHODS FOR MANUFACTURING THREE-DIMENSIONAL THIN-FILM SOLAR CELLS" by Mehrdad Moslehi and incorporated by reference herein, presents a new manufacturing process for producing 3-D thin-film silicon solar cells in which prior art manufacturing methods may not be suitable.

SUMMARY

Therefore a need has arisen for selective etching methods which release a substrate from a reusable template. The separation method must selectively etch a middle porous silicon layer without damaging the template or substrate. Further, the release of the substrate must be timely and efficient.

In accordance with the disclosed subject matter, methods for forming a 3-D thin film silicon substrate (TFSS) from a reusable crystalline silicon template by selectively etching a middle porous silicon layer are provided that substantially reduce disadvantages of prior art methods. Further, the selective etching methods of the present disclosure aim to reduce damage to both the TFSS substrate and template while also minimizing complexity.

A porous silicon layer is formed on a 3-D crystalline silicon template. A variety of methods may be used to form the porous silicon layer, including anodic etching of monocrystalline silicon. A thin film silicon substrate, having reverse features from those of the substrate, is formed on the porous silicon layer. Selectively etching the porous silicon layer from the surfaces of the non-porous silicon layers (template and thin-film substrate) releases the non-porous silicon layers from each other.

Further, the disclosed subject matter presents methods to enhance the etching of porous silicon, while minimizing damage to the thin film silicon substrate and reusable silicon template. One embodiment provides a method and apparatus for degassing an etchant prior to or during etching. Another embodiment provides a method and apparatus for using a vacuum chamber to eliminate trench-clogging bubbles during etching. One embodiment presents a method and apparatus for ultrasonically and megasonically streaming an etchant into the 3-D features of the porous silicon layer. Yet another embodiment provides a method and apparatus for acoustically streaming an etchant to the porous silicon layer. And yet another embodiment provides a method for mechanically delaminating a high porosity silicon layer using ultrasonic energy.

Further, the disclosed subject matter provides several etch chemistries designed to selectively etch the porous silicon layer, while leaving the thin film silicon substrate and crystalline silicon template largely intact. Etch chemistries include TAMH and ammonium persulfate crystalline additive solution as well as a KOH solution.

These and other advantages of the disclosed subject matter, as well as additional novel features, will be apparent from the description provided herein. The intent of this summary is not to be a comprehensive description of the subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description, be within the scope of the accompanying claims.

BRIEF DESCRIPTIONS OF THE DRAWINGS

The features, nature, and advantages of the disclosed subject matter may become more apparent from the detailed description set forth below when taken in conjunction with the drawings in which like reference characters identify correspondingly throughout and wherein.

Figure 15:
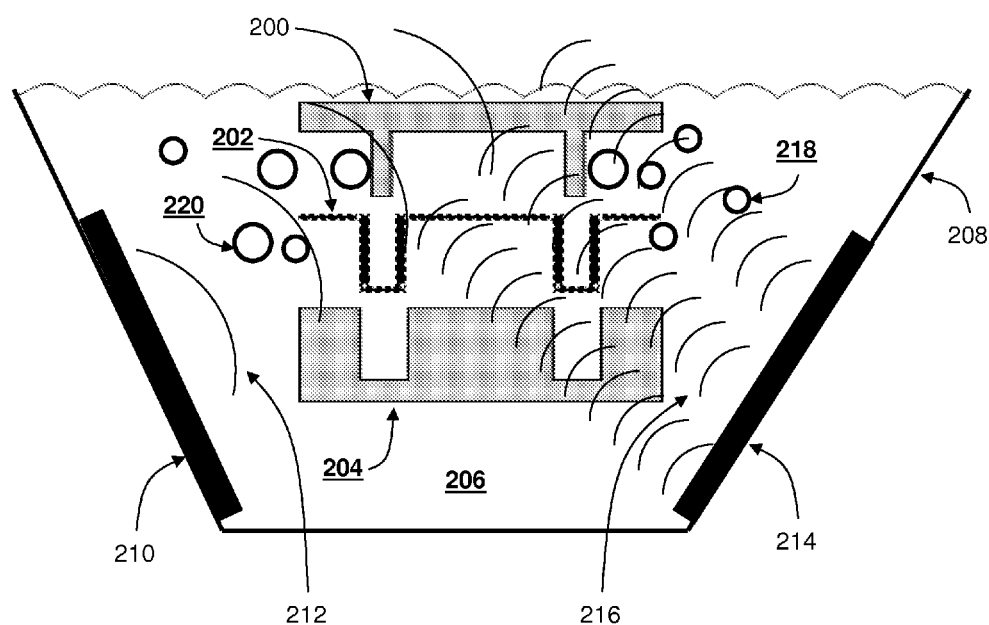
Figure 16:
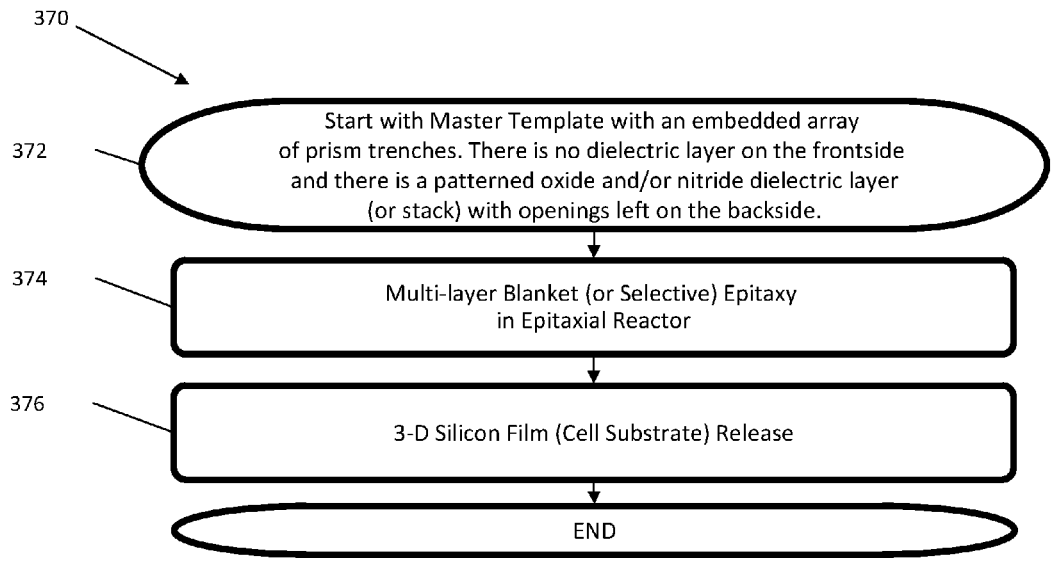
Figure 17:
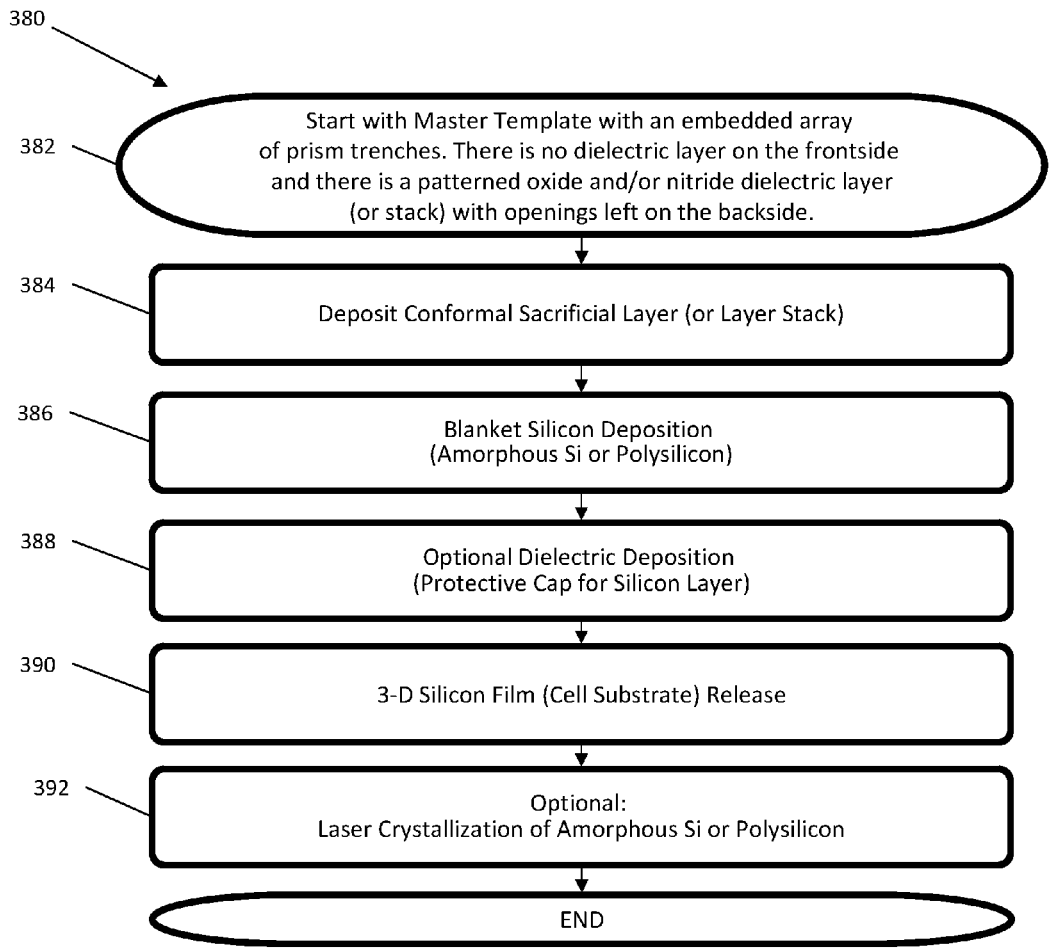
Figure 18:
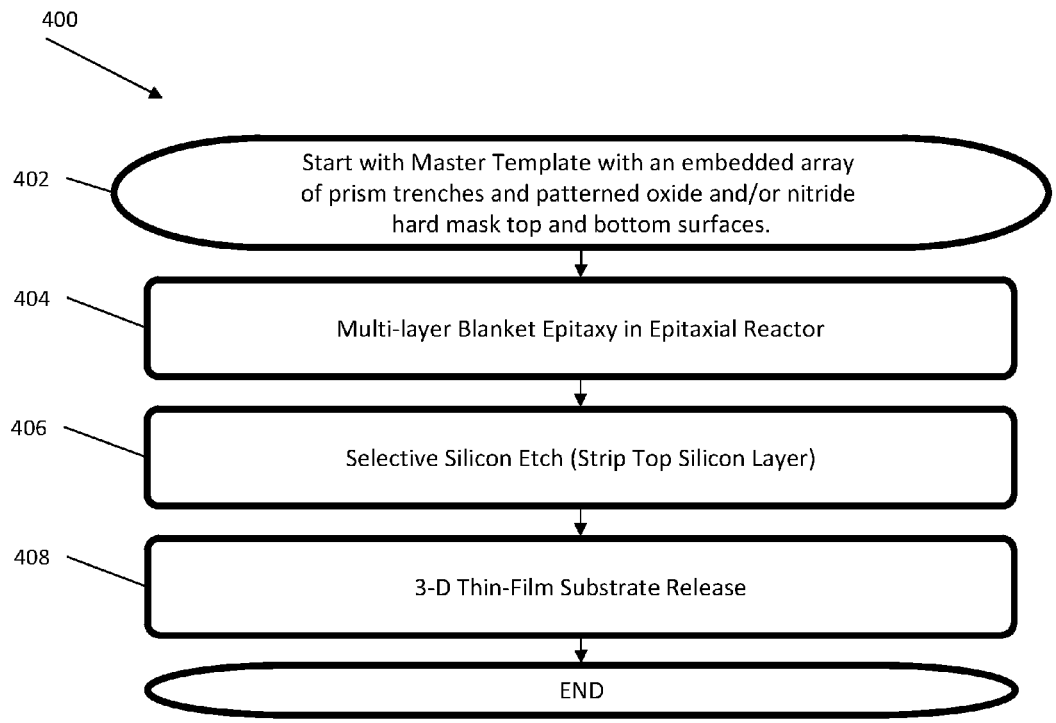
Figure 27:
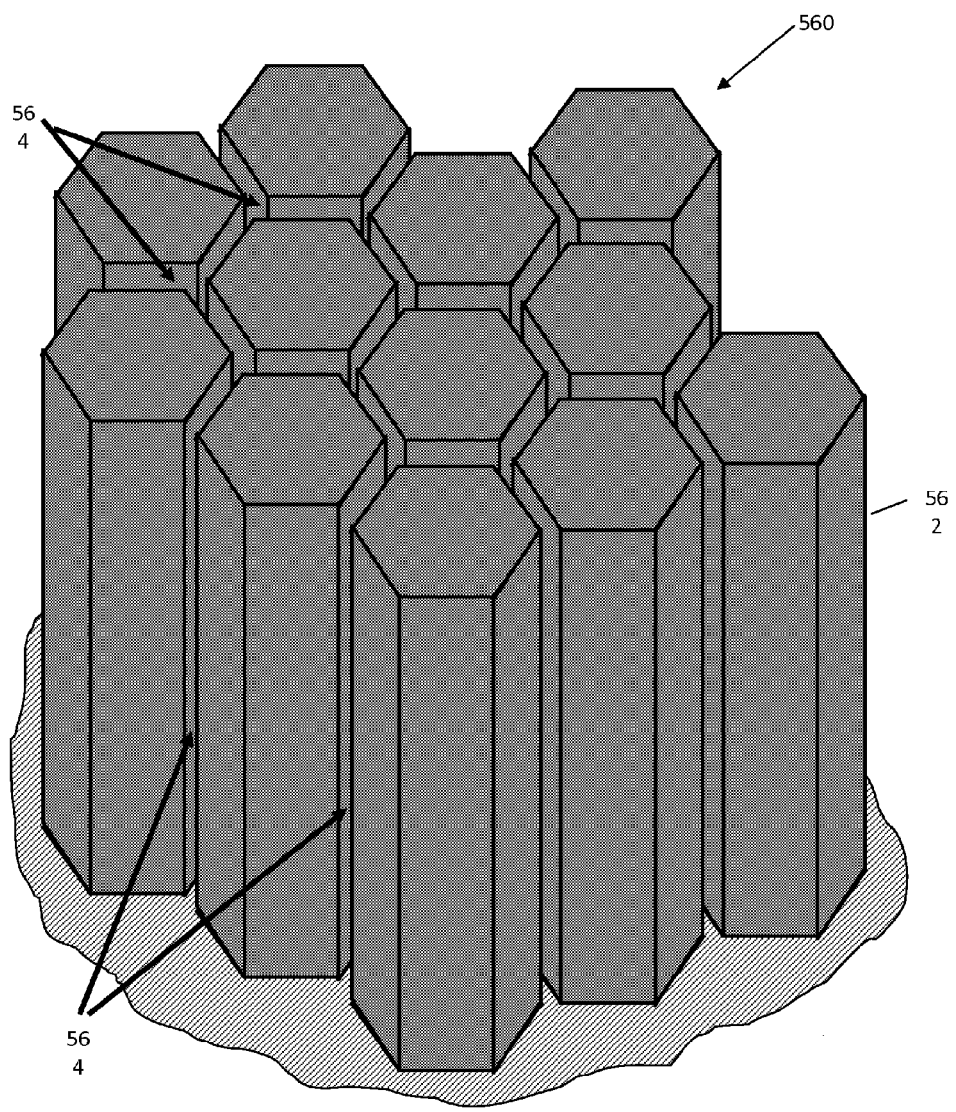
Figure 28:
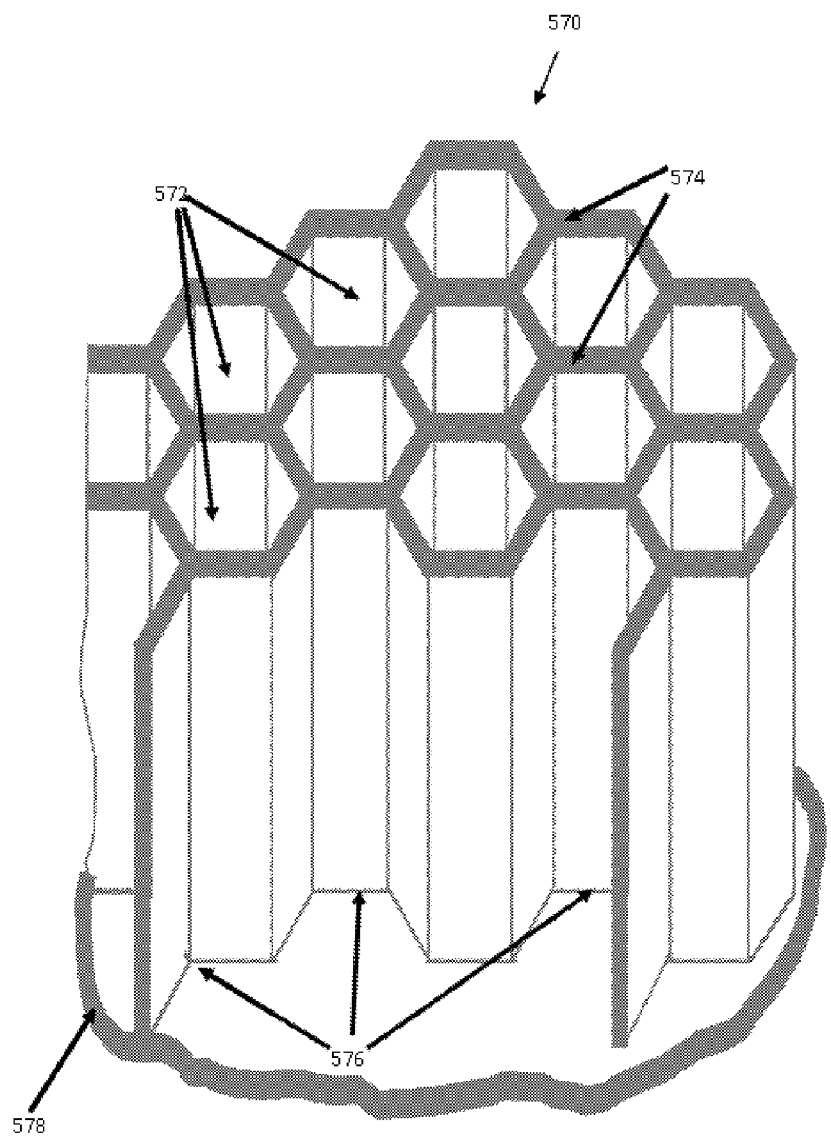
Figure 29:
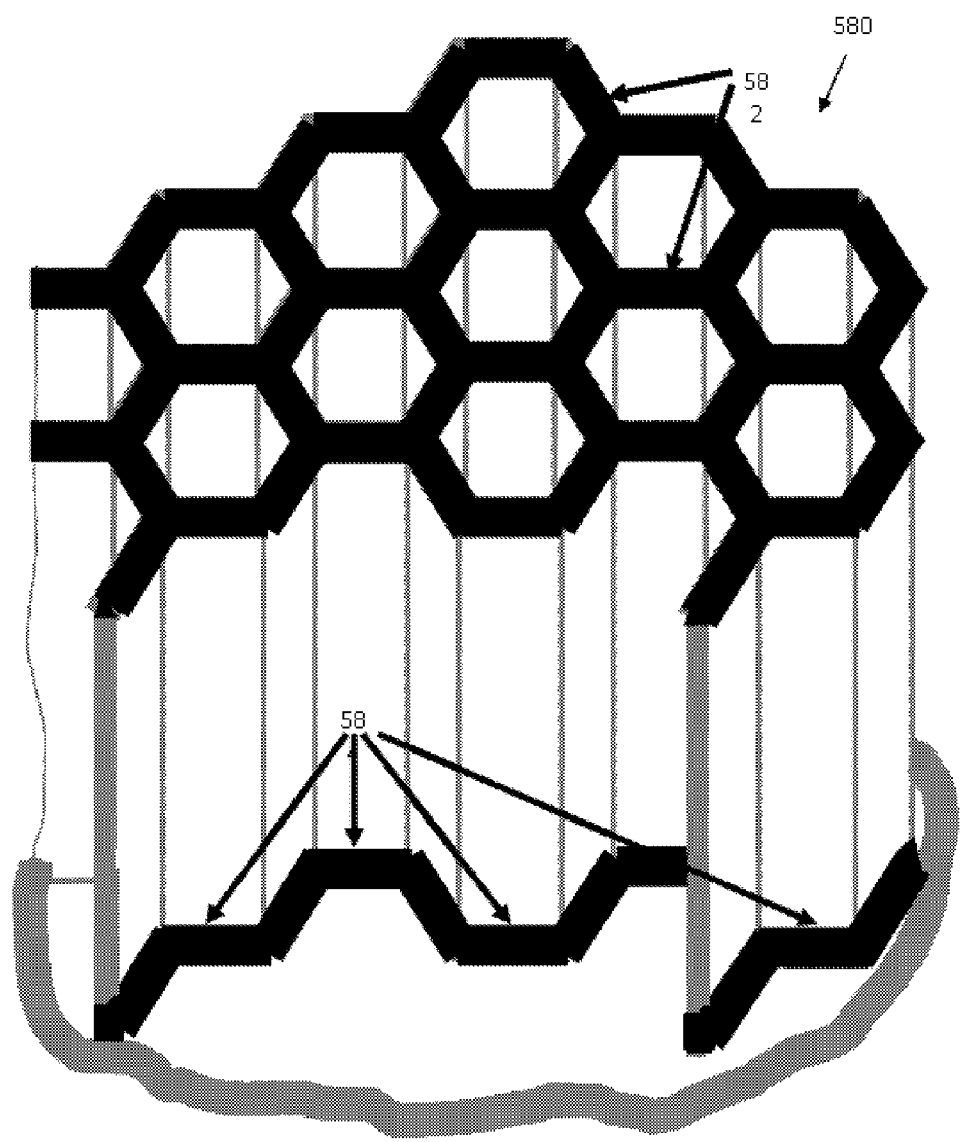

FIG. 15 also illustrates an embodiment for separating a 3-D TFSS and template by selectively etching a middle porous silicon layer through the use of multi-directional acoustic streaming;

FIGS. 16 and 17 show alternative embodiments of a process flows for fabrication of self-supporting hexagonal prism 3-D TFSS substrates including rear base layers (single-aperture TFSS substrates with single-aperture unit cells);

FIG. 18 shows an embodiment of a process flow for fabrication of self-supporting hexagonal prism 3-D TFSS substrates using layer release processing;

FIGS. 19 through 23 illustrate Y-Y cross-sectional views of a template with within-wafer trenches and no dielectrics on the template frontside, as it goes through the key process steps to fabricate a hexagonal prism 3-D TFSS substrate (single-aperture TFSS substrate) with a rear base layer;

FIGS. 24A through 26B show Y-Y cross-sectional views of a unit cell within an embodiment of a single-aperture hexagonal-prism 3-D TFSS substrate including a rear base layer;

FIG. 27 shows a view of an embodiment of a template including hexagonal prism posts;

FIG. 28 shows a 3-D cross-sectional view of an embodiment of a single-aperture hexagonal-prism 3-D TFSS substrate (i.e., TFSS substrate with an integral base layer), including the substrate rear monolithically (integrally) connected to a substantially flat planar thin semiconductor film;

FIG. 29 shows multiple adjacent hexagonal-prism unit cells, after completion of the TFSS fabrication process and after mounting the cell rear base side onto a rear mirror; and FIGS. 30A and 30B show 3-D views of a single unit cell in a dual-aperture hexagonal-prism 3-D TFSS substrate, before and after self-aligned base and emitter contact metallization, respectively.

DETAILED DESCRIPTION

The following description is not to be taken in a limiting sense, but is made for the purpose of describing the general principles of the present disclosure. The scope of the present disclosure should be determined with reference to the claims. And although described with reference to the manufacture and separation of three-dimensional thin-film semiconductor substrate (TFSS), a person skilled in the art could apply the principles discussed herein to the manufacturing of any multi-dimensional substrate.

Preferred embodiments of the present disclosure are illustrated in the drawings, like numbers being used to refer to like and corresponding parts of the various drawings. The innovative 3-D TFSS substrate designs and technologies of the current disclosure are based on the use of a three-dimensional, self-supporting, semiconductor thin film, deposited on and released from a reusable crystalline (embodiments include, but are not limited to, monocrystalline or multicrystalline silicon) semiconductor template, and methods for separating a reusable crystalline semiconductor template and 3-D TFSS substrate.

A preferred semiconductor material for the 3-D TFSS is crystalline silicon (c-Si), although other semiconductor materials may also be used. One embodiment uses monocrystalline silicon as the thin film semiconductor material. Other embodiments use multicrystalline silicon, polycrystalline silicon, microcrystalline silicon, amorphous silicon, porous silicon, and/or a combination thereof. The designs here are also applicable to other semiconductor materials including but not limited to germanium, silicon germanium, silicon carbide, a crystalline compound semiconductor, or a combination thereof. Additional applications include copper indium gallium selenide (CIGS) and cadmium telluride semiconductor thin films.

Further, separation methods disclosed are intended to release a 3-D TFSS substrate from reusable crystalline silicon template through the use of a middle porous silicon layer. In particular, these methods selectively etch porous silicon layer without damaging either the 3-D TFSS or reusable crystalline template. Additionally, a final lift-off or cleaning step may be applied to both the 3-D TFSS and reusable crystalline silicon template to diminish porous silicon residue on these layers. Although the separation methods of the present disclosure selectively etch a middle porous silicon layer to separate a 3-D TFSS substrate and a reusable crystalline silicon template, they may be used to separate any two layers, 3-D or planar, separated by a porous middle layer. Thus, the template may be planar or comprise any combination of 3-D features.

In the present disclosure "selectively etching" a porous semiconductor layer refers to etching the porous semiconductor layer which releases the non-porous semiconductor layers (template and thin-film substrate) from each other. A silicon TFSS substrate and template may be jointly referred to as "non-porous silicon layers" herein. Selectivity (S), for example in reference to silicon, is defined as the etch rate of porous Si ($E_p$) divided by the etching rate of a non-porous silicon layer ($E_s$): $S=(E_p)/(E_s)$. Thus, "selectively etching" a porous silicon layer with a wet etchant is an etching process having a selectivity greater than one. Further, porosity ($\phi$), for example in reference to silicon porosity, is defined as the ratio of void space ($V_v$) to the volume of the material ($V_T$): $\Phi=(V_v/V_T)$.

The present disclosure relates to substrate processing methods and apparatuses. More specifically the present disclosure relates to release methods and apparatuses for forming a 3-D thin film silicon semiconductor (TFSS) from a reusable crystalline silicon template. Before specific embodiments of the present disclosure are described, the overall process is presented.

Figure 1:
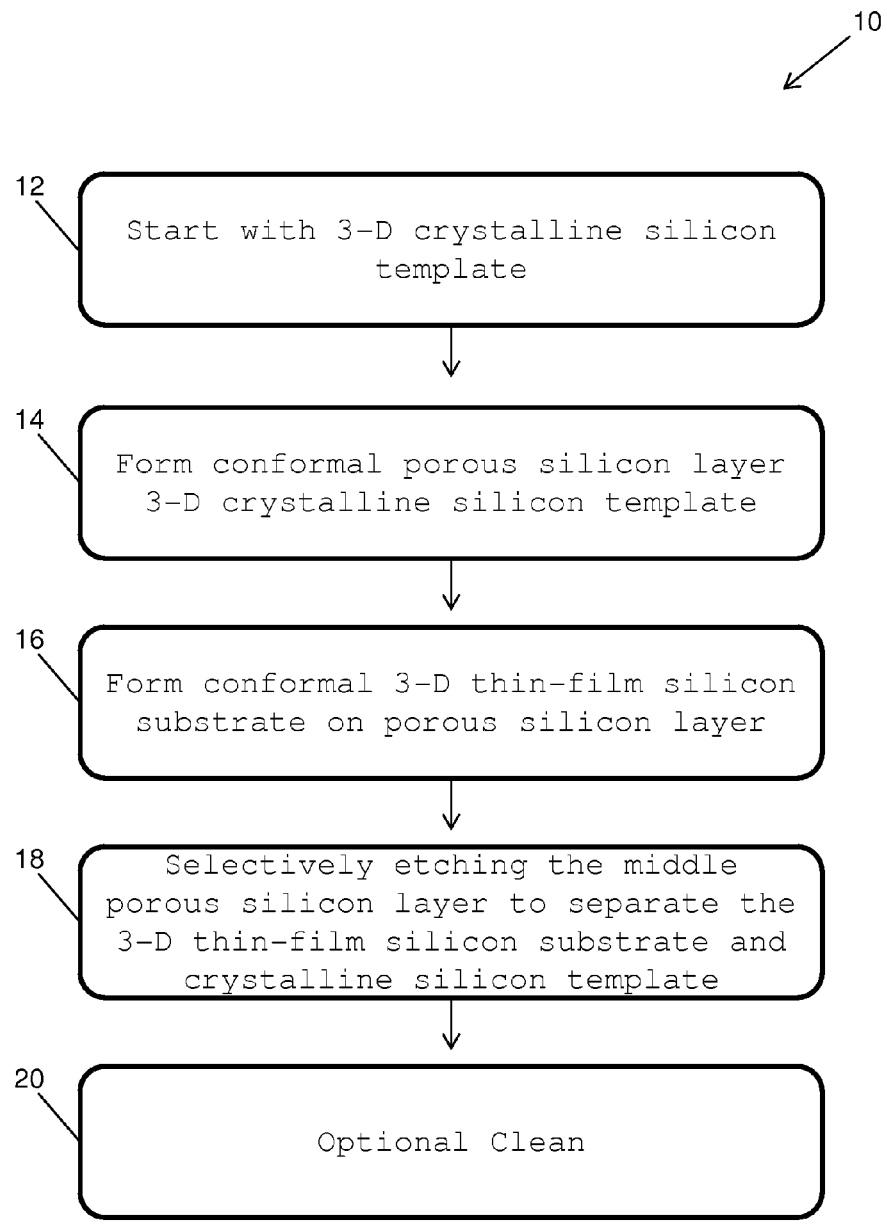
FIG. 1 shows an embodiment of a basic process flow for separating a 3-D TFSS substrate from a 3-D crystalline silicon template.

FIG. 1 shows process flow 10 which presents an embodiment of the overall process flow of the present disclosure. Process flow 10 may be used to process one or more wafers at a time depending on cost, time, quality, and complexity considerations.

The process of the present disclosure begins with step 70, wherein a reusable crystalline silicon template is supplied. The present disclosure does not concern itself with the formation of the template.

Porous silicon formation step 14 results in a porous silicon layer as described heretofore. Step 14 of FIG. 1 involves forming a thin porous silicon sacrificial layer on template deep trenches (trench sidewalls and bottoms) using electrochemical hydrofluoric HF etching (also known as electrochemical anodization of silicon). In one embodiment, the porous silicon has an 80% porosity. The porous silicon layer may be formed by one of two primary techniques as follows: (i) deposit a thin conformal crystalline silicon layer (in one embodiment, a p-type boron-doped silicon layer in the range of 0.2 to 2 microns) on an n-type template substrate, using silicon epitaxy, followed by conversion of the p-type epitaxial layer to porous silicon using electrochemical HF etching; or (ii) convert a thin layer of the template substrate (in one embodiment, a p-type template) to porous silicon (in one embodiment, in the thickness range of 0.01 to 1 micron). The sacrificial porous silicon formed by one of these two techniques also serves as a seed layer for subsequent epitaxial silicon deposition of step 16.

TFSS layer formation step 16 involves performing a hydrogen bake (at 950° to 1150° C.) to clean the surface and to form a continuous sealed monocrystalline surface layer on the surface of the porous silicon sacrificial layer, followed by depositing a blanket layer of doped silicon epitaxy (top only) in an epitaxial processing reactor. In one embodiment, the layer is p-type, boron-doped and has a thickness between 1 and 30 microns.

One aspect of the present disclosure concerns itself with improvements to etching methods and apparatuses of selective etching step 18 of FIG. 1. Improved wet etching methods and apparatuses selectively etch porous silicon and mitigate damage to non-porous silicon layers. Release step 18 involves the etching of the porous silicon layer to separate the TFSS layer and the template. Selective etching step 18 may comprise an immersion process wherein an etchant selectively etches the porous silicon layer. The immersion process may comprise immersing either a single wafer in an etchant, or a batch immersion process wherein a number of wafers are immersed in an etchant. A batch immersion process, which increases the production rate of released TFSS, is preferable to immersing a single wafer. An optional lift off step may then completely separate the TFSS and template after the porous silicon layer is etched in selective etching step 18.

Etching step 18 in FIG. 1 constitutes a change from conventional etching methods which only etch surface layers to form 3-D features on a substrate. Step 18 aims to selectively etch a middle layer (the porous silicon layer) thereby separating, without damaging, the two nonporous silicon layers to form a thin-film silicon substrate comprising 3-D features and a reusable silicon template.

Cleaning step 20 may then involve an optional cleaning step which removes porous silicon residue created on the TFSS substrate and the template by release step 18. Further, step 20 may be combined with step 18 to reduce processing time, cost, and complexity. Thus, process flow 10 produces an undamaged TFSS substrate and minimizes damage to the template.

Figure 2:
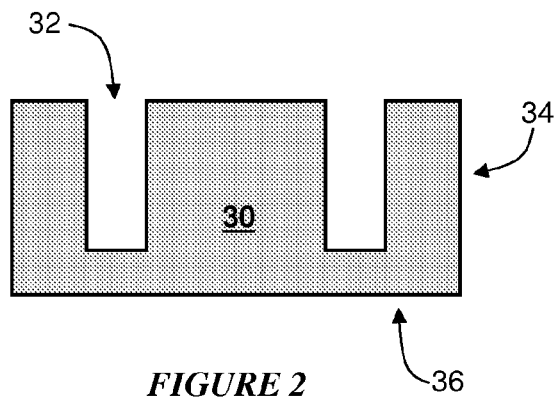
FIGS. 2 through 6 show an illustrative examples of the basic process flow for separating a 3-D TFSS substrate from a 3-D crystalline silicon template described in FIG. 1.
Figure 3:
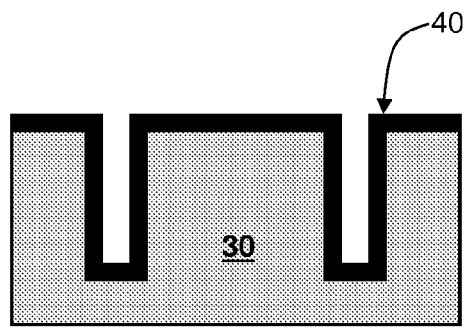

FIGS. 2 through 6 provide illustrative examples of process flow 10 shown in FIG. 1. FIG. 2 corresponds to step 12 of FIG. 1 and shows reusable crystalline silicon template 30. Template 30 comprises base 36, sidewalls 34, and 3-D features 32. The etching process of the current disclosure minimizes damage to reusable crystalline silicon template 30. FIG. 3, corresponding to step 14 of FIG. 1, shows porous silicon layer 40 formed conformal to template 30. A deposition step followed by an anodic etching step forms conformal porous Si layer 40 on template 30.

Figure 4:
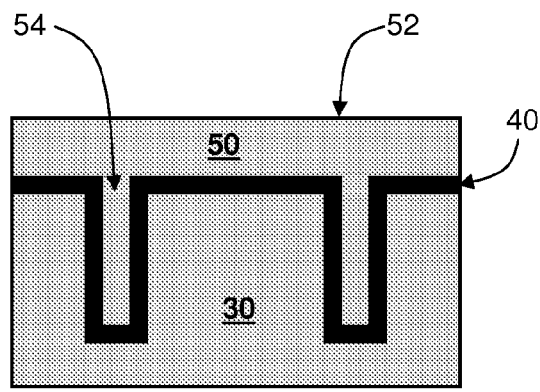

FIG. 4 illustrates TFSS 50 of step 16 of FIG. 1. After the formation of porous Si layer 40 on template 30, epitaxial growth forms thin-film silicon substrate (TFSS) 50 on porous Si layer 40. TFSS 50 comprises reverse 3-D features 54 of template 30, and may also, but not necessarily comprise base 52.

The term "wafer" will be used to describe the structure in FIG. 4 comprising template 30, porous silicon layer 40, and TFSS substrate 50. Additionally, TFSS substrate 50 and template 30 may be jointly referred to as "non-porous Si layers" herein.

Figure 5:
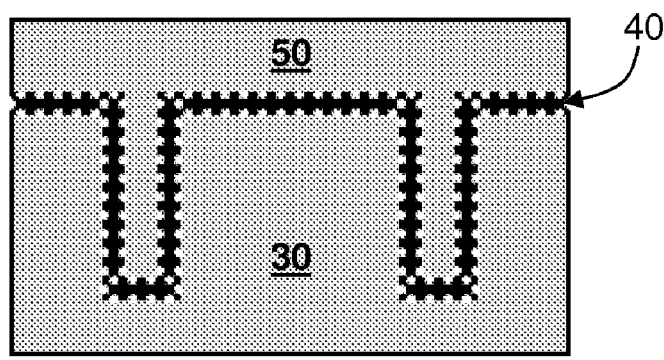

FIG. 5 corresponds to step 18 of FIG. 1. A transport medium, such as a vacuum or electrostatic chuck, places the wafer of FIG. 4 in an etchant to begin the selective etching process of porous silicon layer 40 in order to separate template 30 and TFSS 50. The selective etching methods of the present disclosure are used selectively etch porous silicon layer 40, while mitigating damage to non-porous layers 30 and 50.

Figure 6:
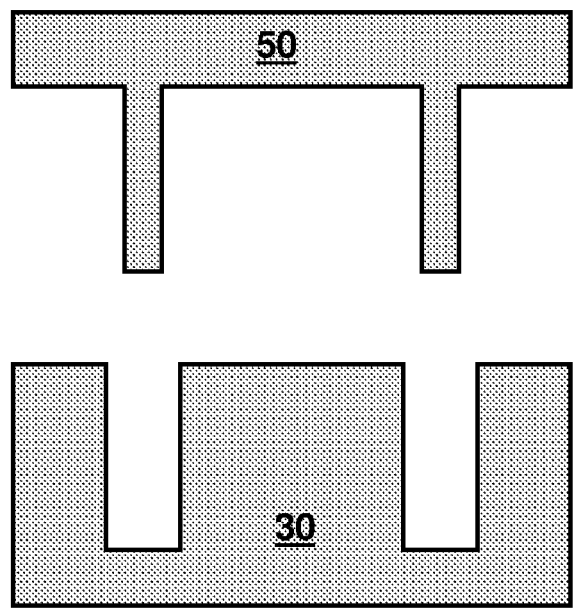

FIG. 6 corresponds to step 20 of FIG. 1 and illustrates the end products: released, undamaged TFSS substrate 50 and template 30, that result from step 20 of FIG. 1. Optional cleaning steps make template 30 ready for a subsequent TFSS formation cycle.

Current etching processes damage non-porous Si layers 30 (template) and 50 (TFSS). Thus, they are unaccommodating to the use of a reusable template. If template 30 is damaged during the etching release process, successive thin-film silicon substrates formed on template 30 are subject to degradation. Further, even thin-film silicon substrates formed on an undamaged template will be degraded if the etching process is unselective. A solar cell formed from a degraded TFSS will have unfavorable performance characteristics. Thus, etching processes which do not etch porous silicon preferentially are poorly suited as release methods on a reusable template. A solution lies in selectively etching porous Si layers with proper etch chemistries and methods.

Additionally, etch rates are a strong consideration for any semiconductor or photovoltaic manufacturing process. Large overhead expenses, for equipment and facility costs, necessitate the need for large production volumes. Economies-of-scale dictate the need for either both speedy and cost-efficient etching process to reduce bottle necks that could reduce solar cell output.

Several etching relationships dictate the speed of etching processes, and will be discussed herein. These factors manipulate etch rate and selectivity of the porous silicon layer, template, and TFSS during the etching process. First, bubbles (gas) created as a result of chemical reactions between an etchant and silicon limit etch rate and selectivity. Efficient etching requires that etchants diffuse into trenches created in cleaved areas between porous Si layers and non-porous Si layers. However, trench clogging bubbles, which occur as a result of etching reactions, limit etchant diffusion rate.

A direct relationship exists between temperature and etch rate. That is, etch rate increases as temperature increases. However, an increased etch rate often results in lower selectivity towards porous Si; since, etch rates of both porous and non-porous Si layers increase, but the etch rate of porous silicon does not increase proportionately to maintain selectivity. This relationship dictates that a lower temperature is desirable for a higher selectivity. However, at lower temperatures bubble formation, as a result of etching processes, increases. Again, bubble formation decreases etch rate. Both etch rate and selectivity are directly proportional to porosity. Therefore, it can be desirable to have a highly porous Si layer. However, other considerations, including the mechanical strength, limit the practicality of a highly porous Si layer.

An objective standard should be achieved to ensure a balance between selectivity and etch rate. Such a standard translates into an objective metric of processing quality, time, and cost. A selectivity of 10,000 and an etch rate of at least 10 µm/min is often preferred. Etch chemistry, temperature, silicon porosity, and bubble reduction may all be manipulated to increase selectivity and etch rate.

In another embodiment of the present disclosure, the thickness of porous silicon layer 40 (FIG. 3) is in the range of 0.1 µm to 10 µm. The porosity of porous silicon layer 40 is in the range of 20% to 80%. Base 36 (FIG. 2) of TFSS 30 is preferred to be in a square or rectangle shapes with its lateral size in the range of 10 mm to 200 mm.

Figure 7:
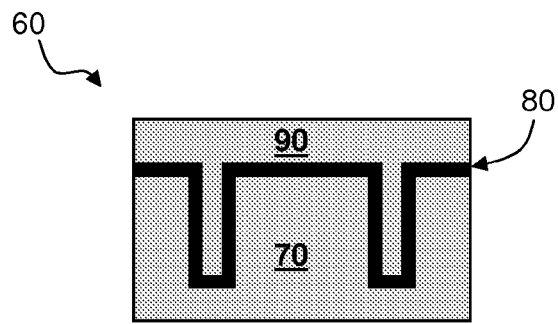
FIGS. 7 through 9 show an illustrative example of selectively etching a middle porous silicon layer.
Figure 8:
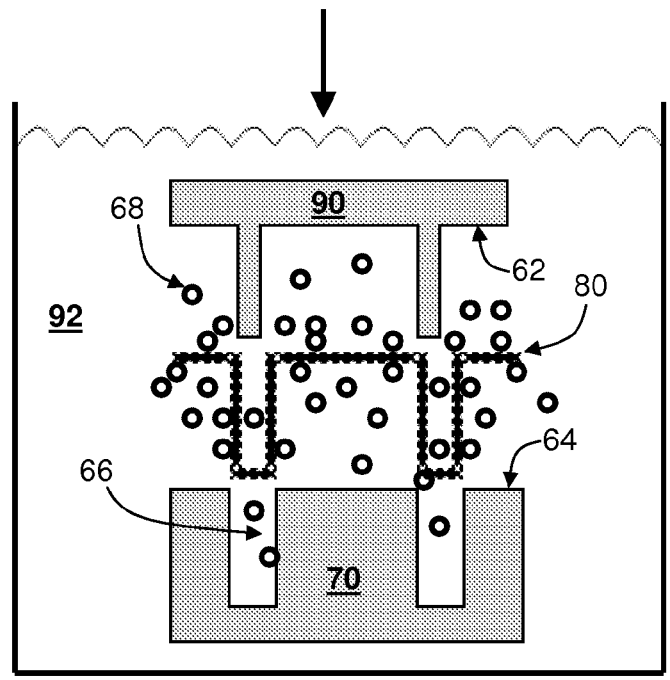
Figure 9:
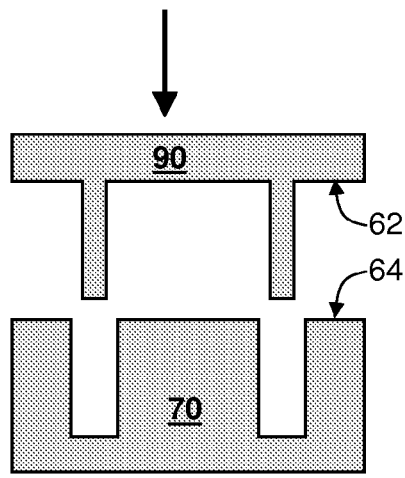

FIGS. 7 through 9 show a selective etching step in accordance with the disclosed subject matter. A transport medium places wafer 60 comprising TFSS 90, porous silicon layer 80, and reusable template 70 in an etchant. As shown in FIG. 8, wafer 60 is submersed in chamber holding etchant 92 in order to allow the etchant to access porous silicon layer 80 and separate reusable template 70 and TFSS 90. The resulting etching reaction is illustrated in FIG. 8 and corresponds to etching step 18 in FIG. 1. Etchant 92 selectively etches porous silicon layer 80 from at least the non-porous silicon layer surface 62 of TFSS 90 and the non-porous silicon layer surface 64 of template 70. To achieve selective etching in a timely manner, the etchant must diffuse into trench areas 66 without the interference of bubbles 68. When the etching reaction is complete or the porous silicon layer has been completely removed from non-porous silicon surface layers 62 and 64, a transport medium removes released TFSS 90 and reusable template 70 from the etchant as shown in FIG. 9. The selective wet etching surface damage to non-porous silicon surface layers 62 and 64 is minimized and TFSS 90 is now ready for further processing and reusable template 70 may be cleaned and conditioned for use in subsequent thin-film silicon substrate manufacturing.

The disclosed subject matter aims to increase the etching of the porous silicon layer and/or decrease the etching of non-porous silicon layers. Thus, an overall aim is to decrease etching time while maintaining selectivity. Further, the methods and apparatuses disclosed may be used separately or in combination to release a TFSS and a template adjoined by a sacrificial porous silicon layer.

Preferable etch chemistries are herein disclosed. Table 1 illustrates the effect of different etch chemistries and trench openings on porous silicon and monocrystalline silicon etch rates. This experiment was carried out on low resistivity p-type 200 mm wafers. First, a porous silicon layer about 5 µm thick was formed. The porous silicon layer was formed by the anodic etching of a silicon wafer in a mixture of HF, IPA and DI water at a current density of 17 mA/cm$^2$. The wafers were then deposited with a 15 µm thick blanket epi layer which was later subjected to DRIE to create the trench openings which allowed the etchant access to the porous silicon layer.

These wafers were cleaved into square one inch by one inch coupons and were etched in an etch solution with megasonic acoustic streaming and at a flow rate of at least 15 lpm. The concentration and temperature were controlled during the experiment and the square coupons were loaded at a horizontal orientation and attached onto a 200 mm wafer to rule out the effects of loading. Etching rate was evaluated as a function of undercut which was also calculated as a lateral etch rate. Etch selectivity is expressed as a ratio of the porous silicon etch rate to the bulk silicon etch rate.

Columns (1) to (4) represent the independent variables of the experiment. Column (1) represent the trial number, column (2) represents etch chemistry, column (3) represents the hydrofluoric acid (HF) treatment time of porous Si, and column (4) represents the trench opening created between the porous Si and non-porous Si layers. Columns (5) through (6) represent statistical data, mean and standard deviation, relating to etch rate. Columns (7) through (9) represent the etch rate of porous Si, bulk Si (non-porous), and etch selectivity.

Runs 1 to 5 present data collected for each etch chemistry and trench opening (2, 5, and 20 um).

TABLE 1

Wet Etch Chemistry versus Etch Rate and Selectivity
Wet Etch Chemistry Screening
on Epi filled (Restricted) Porous Silicon

| Run (1) | Chemistry (2) | HF (50:1) Treatment (3) | Trench Opening, um (4) | Mean U/C, um (5) | C Stdev, um (6) | Lateral Etch Rate, um/hr. (7) | p-type Si Etch Rate, um/hr. (8) | Etch Selectivity (9) |
|---|---|---|---|---|---|---|---|---|
| 1 | 10% v KOH (4.5% w) + Triton X100 | 2 min. | 2 | 78.33 | 4.63 | 156.67 | 7.13E−02 | 2,199 |
|   |   |   | 5 | 91.33 | 1.63 | 182.67 | 7.13E−02 | 2,564 |
|   |   |   | 20 | 137.67 | 8.80 | 275.33 | 7.13E−02 | 3,864 |

TABLE 1-continued

Wet Etch Chemistry versus Etch Rate and Selectivity
Wet Etch Chemistry Screening
on Epi filled (Restricted) Porous Silicon

| Run (1) | Chemistry (2) | HF (50:1) Treatment (3) | Trench Opening, um (4) | Mean U/C, um (5) | C Stdev, um (6) | Lateral Etch Rate, um/hr. (7) | p-type Si Etch Rate, um/hr. (8) | Etch Selectivity (9) |
|---|---|---|---|---|---|---|---|---|
| 2 | 10% v KOH + 90% IPA | 2 min. | 2 | 122.00 | 1.79 | 244.00 | 1.31E−01 | 1,865 |
|   |   |   | 5 | 164.33 | 4.08 | 328.67 | 1.31E−01 | 2,513 |
|   |   |   | 20 | 178.00 | 6.93 | 356.00 | 1.31E−01 | 2,722 |
| 3 | 10% KOH + 2% v HF + Triton X100 | No | 2 | 24.33 | 1.37 | 48.67 | 1.31E−01 | 7,952 |
|   |   |   | 5 | 26.00 | 1.79 | 52.00 | 6.12E−03 | 8,497 |
|   |   |   | 20 | 40.67 | 4.32 | 81.33 | 6.12E−03 | 13,290 |
| 4 | TMAH + Ammonium Persulfate | 2 min. | 2 | 146.33 | 4.08 | 292.67 | 1.75E−03 | 167,047 |
|   |   |   | 5 | 154.33 | 4.63 | 308.67 | 1.75E−03 | 176,180 |
|   |   |   | 20 | 184.67 | 2.07 | 369.33 | 1.75E−03 | 210,807 |
| 5 | Sodium Hydroxide + Surfactant | 2 min. | 2 | 78.00 | 1.26 | 156.00 | 5.70E−02 | 2,737 |
|   |   |   | 5 | 83.00 | 3.74 | 166.00 | 5.70E−02 | 2,912 |
|   |   |   | 20 | 115.33 | 3.27 | 230.67 | 5.70E−02 | 4,047 |

From TABLE 1, it is apparent that the Tetramethylammonium hydroxide (TMAH) with an ammonium persulfate crystalline additive etching chemistry boasted the highest selectivity and fastest etch rate. However, potassium hydroxide (KOH) etching chemistries may also meet specifications through embodiments of the present disclosure.

In one embodiment of the present disclosure, a potassium hydroxide (KOH) solution with various additives is used. These additives may include, but are not limited to, hydrofluoric acid, isopropyl alcohol (IPA), and surfactants (including $(C_{14}H_{22}O(C_2H_4O)_n)$—known as Triton X-100™).

The KOH-IPA solution showed a high porous Si etch rate, but extensive capital expenditure is needed when processing flammable solvents. The KOH solution doped with HF showed a high selectivity but exhibited the slowest etch rate on porous Si. This is possibly due to the neutralization effects of the weak acid to the alkaline solution and the role of the fluoride in the system for etching silicon was not fully realized.

In another embodiment of the present disclosure, TMAH with an ammonium persulfate crystalline additive may be used as an etchant. TMAH etches porous silicon selectively, but it also etches porous silicon slowly. An ammonium persulfate crystalline additive increases TMAH etch rate while also maintaining selectivity.

An exemplary feature of the TMAH chemistry is that there is a competing hydrolysis reaction in the system and oxidation reaction at the surface of the silicon. It is a very slow reaction that is driven into completion by temperature and bath age in an alkaline medium. This results in the formation of a passive oxide layer at the silicon surface. A passive oxide layer at the silicon surface is desirable since selectivity is increased. Etch selectivity increases because TMAH is a poor etchant for $SiO_2$. Thus, the $SiO_2$ protects bulk silicon from being etched. The etching reaction is explained in the following formulas:

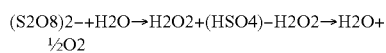

Oxidation of the silicon by the peroxide group to form silicate

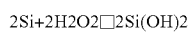

Silicates further react with hydroxyls from TMAH to form a water soluble silicon salt.

$$Si(OH)2+4(OH)-\rightarrow SiO2(OH)2+2H2O$$

With constant temperature, solution agitation, and TMAH concentration the etching continues until all the porous silicon is completely etched off from the bulk silicon surface. One of the disadvantages of this etching chemistry is the decomposition of ammonium persulfate at higher temperatures. Thus, it is important that the solution temperature is controlled to prevent solution stability issues that significantly reduce etch rates. Further, implementation of TMAH ammonium persulfate etchant may be prohibitively expensive.

As described earlier, a deposition and anodization process forms a porous silicon layer conformal on a reusable template. Epitaxial growth then forms a TFSS with reverse features to that of reusable template on the porous silicon layer. The template, porous silicon layer, and TFSS being referred to as a wafer herein. The porous silicon layer is then etched away separating the reusable template and TFSS. And the released TFSS comprises reverse 3-D feature patterns from that of the template.

A vacuum apparatus and degassing apparatus may be used in embodiments of the present disclosure to degass etch chemistries. An etch chemistry may be degassed using an inline degas unit or a degassing hydrophobic membrane. Both are commercially available and are widely used in the ink industries.

Figure 10:
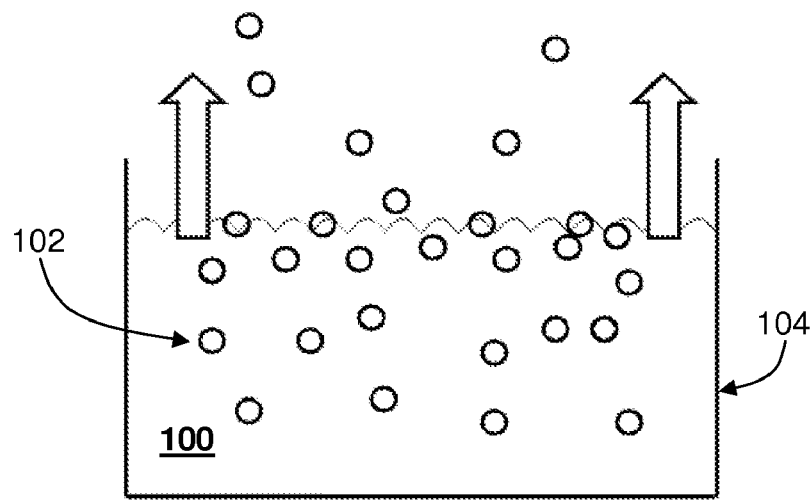
FIG. 10 illustrates an embodiment for separating a 3-D TFSS and template by selectively etching a middle porous silicon layer by degassing the etchant prior to use.

FIG. 10 presents an embodiment of a wet etching step designed to improve the etching release step 18 of FIG. 1. A degassing apparatus removes bubbles 102 from etchant 100 housed in etching chamber 104 prior to wafer loading. A reduction in bubbles 102 prior to etching is desirable because bubbles are formed in etch chemistry 200 during the selective etching of the porous silicon layer. Reduction of bubbles 102 in etchant 100 prior to etching increases etchant 100 diffusion into trenches during etching. An increase in etchant 100 diffusion, in turn, produces a decrease in etch time of porous silicon.

Figure 11:
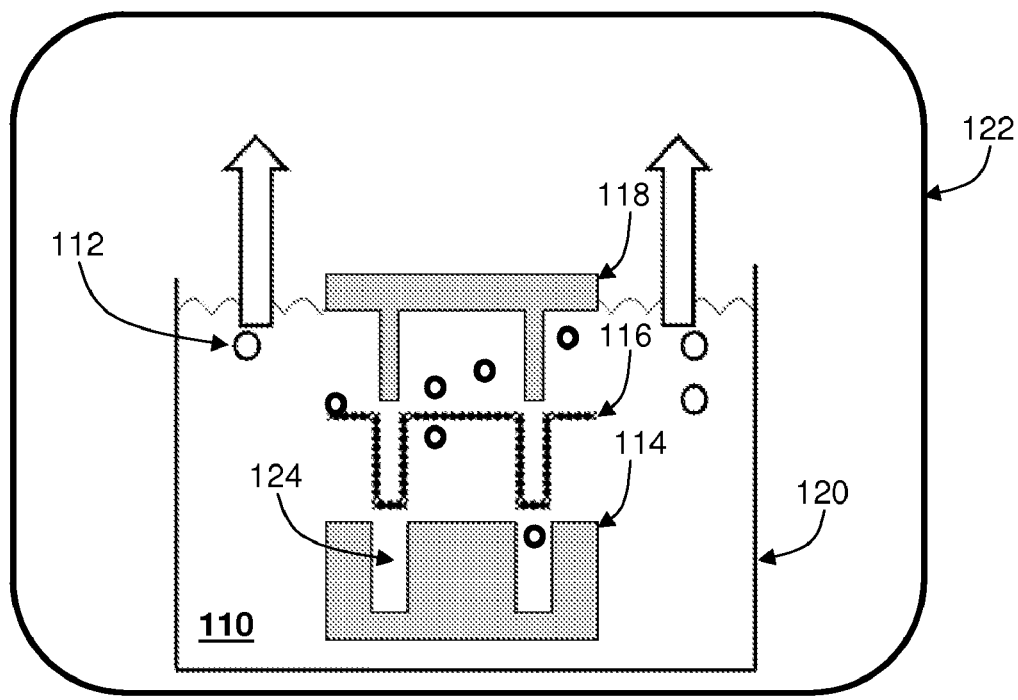
FIG. 11 illustrates an embodiment for separating a 3-D TFSS and template by selectively etching a middle porous silicon layer in a vacuum chamber.

FIG. 11 presents another embodiment of a wet etching step of the present disclosure. The selective etching of the wafer takes place in vacuum chamber 214, which enhances etching of porous silicon layer 116 to separate template 114 and TFSS 118. Etching porous silicon layer 116 in vacuum chamber 122 accelerates the movement, breakup, and release of bubbles 112 formed on trench walls. This results in increased etchant 110 diffusion and decreased etch times. FIG. 11 shows etchant 110 selectively etching porous silicon layer 116 in etching chamber 120. Vacuum chamber 122 removes trench clogging bubbles 112 as they are formed. A clear trench path, such as that shown in trench 124, is created between porous silicon layer 116 and template 114.

The degassing embodiment and vacuum embodiment of the present disclosure may be combined to reduce bubble formation pre-etch and during etching. FIG. 10 shows bubbles formed pre-etch, as bubbles 102, which are removed from etchant 100 by a degassing apparatus. The degassing apparatus may be, but is not limited to, a degassing unit or a degassing hydrophobic membrane. After degassing is complete, the etching process may begin. FIG. 11 shows template 114, porous silicon layer 116, and template 118 in etchant 110 in etching chamber 200. The etching chamber is housed inside vacuum chamber 122. Trench clogging bubbles, shown as bubbles 112, created as a result of the etching reaction are removed, dislodged, or broken up by vacuum forces imposed by vacuum chamber 122. Etchant 110 reaches the 3-D features/trenches of template 114 due to the reduction of bubbles and the releasing process is sped up.

In yet another selective etching embodiment of the present disclosure, etchant is streamed towards the TFSS, template and porous Si layer thereby increasing the flow rate while also breaking or fragmenting bubbles caused by the etching reaction.

Megasonically or ultrasonically streaming a liquid, such as de-ionized (DI) water, is a widely used technique in the semiconductor industry for cleaning substrates. Currently, megasonic and ultrasonic energy is created by a piezoelectric crystal supplied with a high AC voltage. The voltage causes a disturbance in the crystals lattice structure. The crystal vibrates in the megasonic (700-1000 KHz) or ultrasonic (100-400 KHz) range depending on the frequency of voltage supplied. Vibrations in the crystal lattice form low pressure and high pressure regions in a liquid resulting in bubble formation and increased flow rate of the etchant. Bubbles formed by the megasonic or ultrasonic energy remove particulate matter, on the surface of a substrate, by breaking. Bubbles formed by megasonic and ultrasonic energy break on the substrate surface thereby dislodging particulate matter. Ultrasonic cleaning has been report to remove particulate matter as small as 0.1 µm from a substrate.

In one embodiment of the present disclosure, megasonic and ultrasonic energies increase etchant diffusion into trenches by increasing etchant flow rate. Bubbles formed as a result of megasonic energy are broken by periodic pulsing of ultrasonic energy. Bubbles formed as a result of ultrasonic energy are too large to enter trenches created while etching; thus, these bubbles do not decrease etchant diffusion. Further, low and high pressure regions in the etchant, created by the energies, fragment trench clogging bubbles, allowing faster diffusion of the etchant into trenches or 3-D features of the template. Etchant diffusion increases etch rates and processing time is thus decreased. Selectivity may be reduced, but the overall gain in etching rate outweighs the loss in selectivity.

Figure 12:
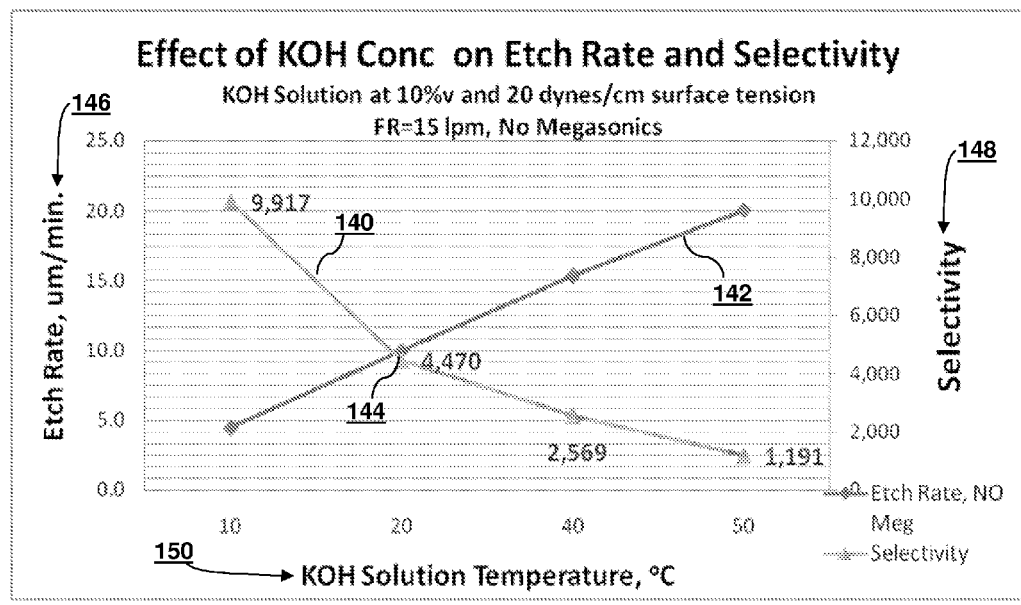
FIG. 12 is graph illustrating the results of an etching process conducted with no megasonic streaming.

FIG. 12 is graph displaying the relationship of etch rate and selectivity over temperature for a particular KOH solution conducted with NO megasonic streaming. Y-axis 146 represents etch rate, y-axis 148 represents selectivity, and x-axis 150 represents temperature. X-axis 150 characterizes etchant temperatures between 0° C. and 60° C. Y-axis 146 characterizes porous silicon etch rate in the range between 0 µm/min and 25 µm/min. Y-axis 148 characterizes selectivity of porous silicon and bulk silicon in a range of 0 to 12,000. Line 142 illustrates the relationship between etch rate, y-axis 146, and temperature, x-axis 150. Line 140 illustrates the relationship between selectivity, y-axis 148, and temperature, x-axis 150. Intersection 144 shows where the etch rate of the KOH chemistry meets a prescribed etch rate metric of 10 µm/min on line 142. The graph of FIG. 12 represents the result of an etch experiment conducted with NO megasonic streaming.

As shown in FIG. 12, etch rates 142 with no megasonic streaming fall below the prescribed metric of 10 µm/min until the etchant is heated to approximately 20° C., shown on FIG. 12 as intersection 144. However, line 140 illustrates that at temperatures above 20° C., selectivity falls well below the prescribed selectivity standard of 10,000.

Figure 13:
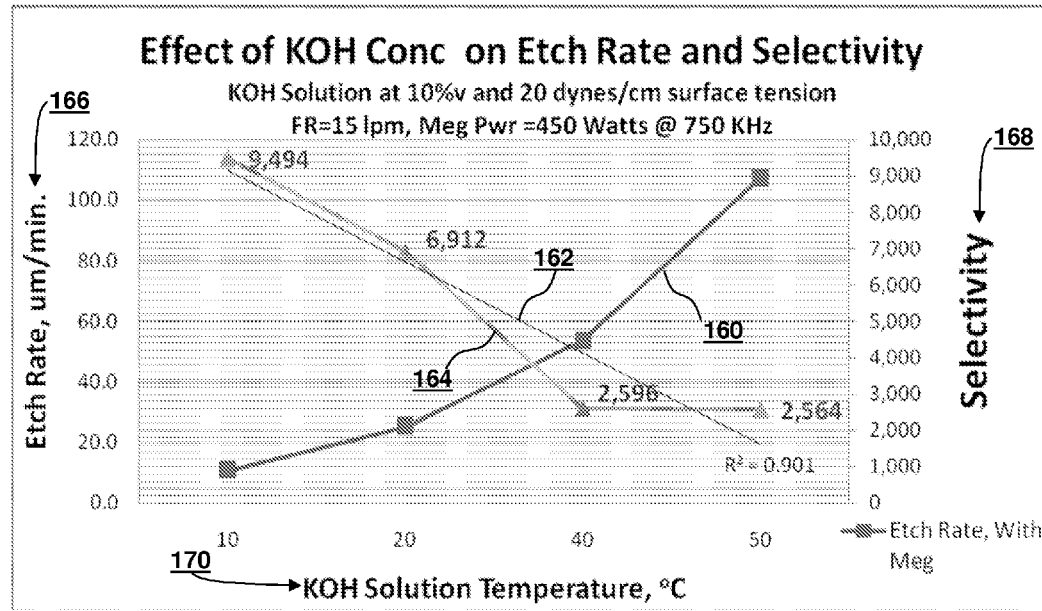
FIG. 13 is graph illustrating the results of an etching process conducted with megasonic streaming.

FIG. 13 is graph displaying the relationship of etch rate and selectivity over temperature for a particular KOH solution conducted with megasonic streaming. Y-axis 166 represents etch rate, y-axis 168 represents selectivity, and x-axis 170 represents temperature. X-axis 170 characterizes etch chemistry temperatures between 0° C. and 60° C. Y-axis 166 characterizes porous silicon etch rate in the range between 0 µm/min and 120 µm/min. Y-axis 168 characterizes selectivity between porous silicon and bulk silicon in a range of 0 to 10,000. Line 160 illustrates the relationship between etch rate, y-axis 166, and temperature, x-axis 170. Line 164 illustrates the relationship between selectivity, y-axis 168, and temperature, x-axis 170. The graph FIG. 13 represents the result of an etch experiment conducted with megasonic streaming of 450 Watts at 750 KHz.

As shown in FIG. 13, the etch rate of porous silicon falls within the prescribed metrics of etch rate (10 µm/min) and selectivity (10,000) for all temperatures represented on line 160. Line 162 shows that selectivity is still below the prescribed metric of 10,000, and temperatures between 10° C. and 20° C. provide adequate selectivity (at 10° C. selectivity is 9,494 and at 20° C. selectivity is 6,912). High etch rates (120 µm/min-60 µm/min) for porous silicon reduce the amount of etch time and damage done to non-porous silicon layers.

Figure 14:
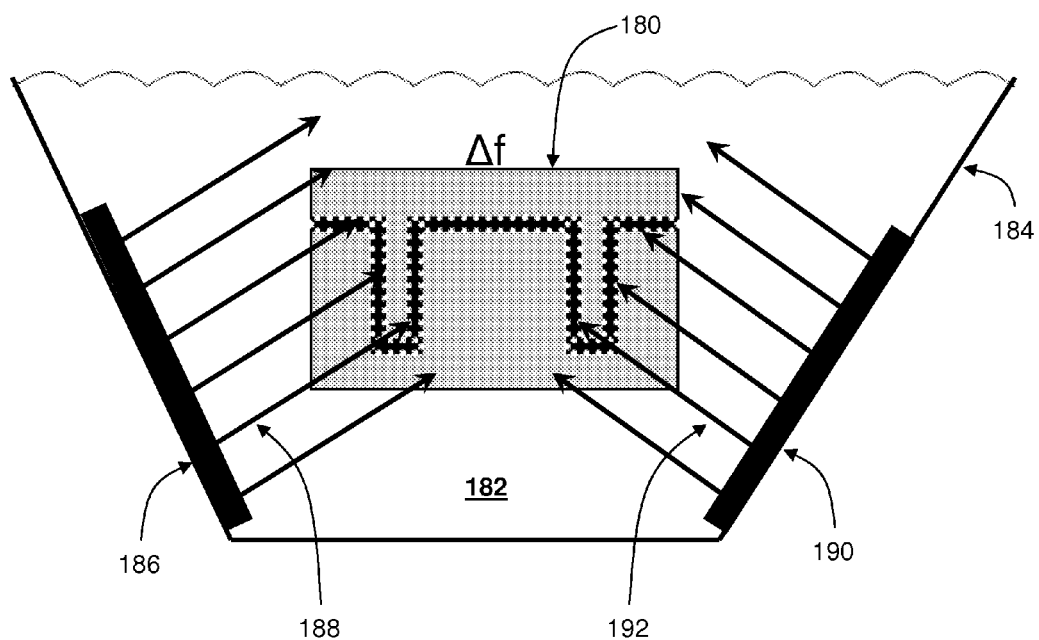
FIG. 14 illustrates an embodiment for separating a 3-D TFSS and template by selectively etching a middle porous silicon layer through the use of multi-directional acoustic streaming.

FIG. 14 illustrates another embodiment of the selective etching methods of the present disclosure. Wafer 180 is submerged in etchant 182 in etching chamber 184. Transducer 186 creates low frequency acoustic waves 188 and transducer 190 creates high frequency acoustic waves 192. Acoustic waves 188 and 192 agitate etchant 182 and are directed towards wafer 180. The resulting etching process selectively etches the porous silicon layer of wafer 180.

Sufficiently differing acoustic wave frequencies ($\Delta f$), shown as low frequency acoustic waves 188 and high frequency acoustic waves 192, mitigate wave cancellation effects and allow enhanced bubble shearing. Acoustic streaming, contrasting the ultrasonic and megasonic streaming described heretofore, employs shear forces to completely destroy a bubble. That is, rather than fragment a large bubble into smaller bubbles, as may occur in ultrasonic and megasonic streaming, bubbles are completely destroyed.

FIG. 15 presents another view of the release of a TFSS from a reusable template by selective etching using acoustic streaming. TFSS 200, porous silicon layer 202, and reusable template 204 have been separated by the selective etching of etchant 206 in etching chamber 208. Transducer 210 creates low frequency acoustic waves 212 and transducer 214 creates high frequency acoustic waves 216. Acoustic waves 212 and 216 agitate etchant 206 and are directed towards middle porous silicon layer 202 resulting in the release of TFSS 200 from reusable template 204. High frequency acoustic waves 216 waves shear small bubbles 218 and low frequency acoustic waves 212 waves shear large bubbles 220. Wave interference effects may produce a range of intermediate frequencies.

In another embodiment of the present disclosure, a mechanical delaminating process is used to release the TFSS and template from the porous Si layer. The porous silicon bi-layer of the present may comprise a layer of 70%-80% porosity, followed by a lower porosity layer. In this embodiment, a porous silicon bi-layer is used and high porosity silicon layer is mechanically delaminated using low frequency ultrasonic energy.

The TFSS is formed on top of the porous silicon bi-layer. Selective etching of the porous silicon layer is performed using a low frequency ultrasonic energy. The wafer is submerged in etchant and the ultrasonic energy fractures the high porosity silicon layer allowing faster diffusion of etchant into the trenches and 3-D features of the template.

The porous silicon layer may comprise, for example, a first thin porous silicon layer on top and first formed from the bulk silicon of the silicon wafer template. The first thin layer has a low porosity of 15%~30%. A second thin porous silicon layer is directly grown from the bulk silicon of wafer template and is underneath the first thin layer of porous silicon. The $2^{nd}$ thin porous silicon layer has a high porosity in the range of 60%~85%. The top low porosity layer is used as a seed layer for high quality epitaxial silicon growth (for the formation of the epitaxial silicon layer forming the TFSS) and the underneath high porosity silicon layer is used for easier release of the epitaxial silicon layer forming the TFSS. Before the epitaxial silicon growth, the wafer is baked in a high temperature hydrogen environment within the epitaxial silicon deposition reactor.

In operation, the present disclosure enables high-volume production of 3-D TFSS trough the use of a re-usable template. First, a sacrificial porous silicon layer is formed on a 3-D TFSS template conformal to the features of the template. Next, an epitaxial growth step forms a 3-D TFSS on the porous silicon layer. The porous is silicon layer is then etched releasing the 3-D TFSS from the template. The process occurs while producing minimal damage to the template and substrate. A selective etching process selectively etches the porous silicon layer to reduce damage to the 3-D TFSS and template.

The methods and apparatuses described heretofore may be combined or performed separately to ensure effective fracture of the porous silicon layer, while minimizing damage to non-porous silicon layers.

The present disclosure has particular application in the fabrication of thin-film solar cells. Accordingly the following FIGS. 16 through 30B present an illustrative method and apparatus of a thin-film solar cell suitable for the disclosed methods and devices for separation. For a more detailed description of the subject matter to which the following FIGS. 16 through 30B pertain, reference is now made to co-pending U.S. patent application Ser. No. 11/868,489, entitled "METHODS FOR MANUFACTURING THREE-DIMENSIONAL THIN-FILM SOLAR CELLS," (the "'489 application") having common inventors with the present disclosure and which is here expressly incorporated by reference. Note that the following illustrative drawings and explanations derive from the '489 application and, accordingly, not all referenced items in the following figures are explained in complete detail. In the event that explanations for such reference items is desired, reference may be readily made to the '489 application.

FIGS. 16 and 17 show two different process flow embodiments for fabricating hexagonal-prism dual-aperture 3-D TFSS substrates with rear base layers using a suitable template. FIG. 16 depicts an embodiment of a process flow 370 using layer release processing. This flow is based on the use of $Ge_xSi_{1-x}$ sacrificial layer deposition and blanket or selective in-situ-doped epitaxial silicon deposition. The resulting hexagonal-prism unit cells have open apertures on prism top and are terminated at the rear with a rear base layer (in one embodiment, a relatively flat thin silicon layer). Again, the process flow of this embodiment may be easily adjusted in order to use polysilicon, amorphous silicon, or a non-silicon crystalline or polycrystalline/amorphous silicon material. In step 372, a patterned honeycomb-prism template is provided. This template has already been processed to form an embedded array of trenches along with shallower/wider trenches (or trench shoulders) stacked on top of narrower/deeper trenches. There is no dielectric layer on the template frontside, and there is a patterned oxide and/or nitride dielectric layer (or stack) with openings left on the template backside. In step 374, a multi-layer blanket epitaxy is performed in an epitaxial reactor, including the following in-situ process steps. First, $H_2$ bake or $GeH_4/H_2$ bake is used for in-situ surface cleaning. Next, a thin $Ge_xSi_{1-x}$ epitaxial layer is deposited (in one embodiment, on the top only). In one embodiment, this layer is between 10 and 1000 nanometers. Next, a doped silicon epitaxial layer is deposited on the top only. In one embodiment, this layer is p-type, boron-doped and between 1 and 30 microns thick. The in-situ doping (boron doping) profile may be flat or graded. In case of grading, boron doping concentration is gradually increased during the deposition of the silicon epitaxial layer, with a lower concentration at the beginning and a higher concentration towards the end of the epitaxial growth process. This graded base doping may provide a field-assisted drift component for efficient collection of photo-generated carriers, substantially reducing the impact of recombination losses. It also reduces base sheet resistance and ohmic losses. The silicon epitaxial layer thickness is set such that the deep trenches are fully filled with silicon while the shallow (wider) trenches (top trench shoulders) receive epitaxy on their sidewalls and their central regions are left with self-aligned shallow hexagonal troughs. In step 376, the 3-D TFSS substrate is released. A highly selective isotropic wet or dry etch of $Ge_xSi_{1-x}$ is performed, with very high selectivity with respect to silicon. In one embodiment, a mixture of hydrofluoric acid, nitric acid and acetic acid (HNA) is used to selectively etch the $Ge_xSi_{1-x}$ layer. Alternatively, a mixture of ammonia, peroxide, and water ($NH_4OH+H_2O_2+H_2O$) may be used. The wet etchant selectively removes the sacrificial $Ge_xSi_{1-x}$ layer by reaching the sacrificial layer through the template backside dielectric openings. This process releases the hexagonal prism 3-D TFSS substrate, which may then be used for subsequent 3-D TFSS fabrication. In another embodiment, the 3-D TFSS substrate may be released by the methods of the present disclosure.

Note that the template backside openings may be formed directly in silicon backside without a need for the backside dielectric. Alternatively, the sacrificial $Ge_xSi_{1-x}$ layer may be replaced by forming porous $Ge_xSi_{1-x}$ layer or porous silicon layer.

FIG. 17 depicts an embodiment of a process flow 380 for fabrication of self-supporting hexagonal-prism single-aperture 3-D thin-film polysilicon or amorphous silicon TFSS substrates with rear base layers made of polysilicon or amorphous silicon using layer release processing, without the use of epitaxial silicon processing. The amorphous silicon or polysilicon layer may be optionally crystallized using laser crystallization as part of the flow. This process flow uses a dielectric sacrificial layer such as $SiO_2$ (deposited using LPCVD or thermally grown) in conjunction with conformal amorphous silicon or polysilicon deposition for the silicon absorber layer. Step 382 (providing a substrate) corresponds to step 372 in FIG. 16. Step 384 involves depositing a conformal sacrificial layer (or a layer stack). First, a thin layer of a sacrificial material is deposited by conformal layer formation (LPCVD or thermal oxidation). In one embodiment, the sacrificial material is $SiO_2$, with a thickness of between 50 and 2000 nanometers. This sacrificial oxide layer conformally covers the hexagonal-prism trench walls and the template frontside. If subsequent laser crystallization is used, step 384 also includes depositing a thin nitride layer by LPCVD. In one embodiment, this nitride layer is $Si_3N_4$, with a thickness between 100 and 1000 nanometers. The sacrificial layer may be made of porous silicon instead of oxide and/or nitride. Step 386 involves deposition of a blanket silicon layer using conformal deposition. In one embodiment, this blanket silicon layer may be amorphous silicon or polysilicon, p-type in-situ doped with boron, having a thickness between 1 and 30 microns. Note that the silicon thickness is set such that the deep trenches are fully filled with silicon while the shallow (wider) near-surface trenches receive silicon on sidewalls, and their central regions are left with self-aligned relatively shallow hexagonal troughs or trenches. Step 388 involves depositing an optional thin silicon nitride dielectric layer on top by LPCVD or PECVD to serve as a protective cap for silicon layer. In one embodiment, this layer is between 100 and 1000 nanometers. Step 390 involves 3-D TFSS substrate release. In one embodiment and when using a silicon dioxide sacrificial layer, hydrofluoric acid (HF) is used to etch the oxide sacrificial layer. In another embodiment and when using a porous silicon sacrificial layer, a mixture of ammonia, peroxide, and water ($NH_4OH+H_2O_2+H_2O$) or a mixture of hydrogen peroxide and hydrofluoric acid ($H_2O_2+HF$) or a suitable composition of tri-methyl-ammonium-hydroxide (TMAH) may be used. The etch composition and temperature may be adjusted to achieve maximum etch selectivity for porous silicon with respect to silicon. This process releases the hexagonal-prism 3-D TFSS substrate. Note that the wet etchant selectively removes the sacrificial $Ge_xSi_{1-x}$ layer (or porous silicon sacrificial layer) by reaching the sacrificial layer through the template backside dielectric openings (note that backside openings may be formed directly in the template substrate backside without using any dielectric on the template backside). In another embodiment, the 3-D TFSS substrate may be released by the methods of the present disclosure. This process releases the hexagonal-prism 3-D TFSS substrate from the template. An optional step 392 involves laser crystallization of the released 3-D thin-film amorphous silicon or polysilicon substrate to form a large-grain polysilicon microstructure. The silicon nitride layer surrounding silicon serves as protective cap. The nitride layer is then selectively stripped. The hexagonal-prism 3-D TFSS substrate may then be used for subsequent 3-D TFSS fabrication.

FIG. 18 shows an embodiment of a process flow 400 for fabrication of self-supporting (free standing) hexagonal-prism 3-D TFSS substrates using layer release processing. This process flow results in dual-aperture hexagonal-prism 3-D TFSS substrates with hexagonal prisms with open apertures formed on both the top and rear (there is no rear base layer). In step 402, a patterned hexagonal-prism (or another prism array) template is provided. This template has already been processed to form an embedded array of deep hexagonal-prism trenches. There is a patterned dielectric (oxide and/or nitride) hard mask on the template top and rear surfaces. Step 404 involves a multi-layer blanket epitaxial semiconductor deposition in an epitaxial growth reactor. Step 404 first involves an $H_2$ or $GeH_4/H_2$ in-situ bake cleaning, which is performed after a standard pre-epitaxial wet clean (the latter if necessary). Next, a thin sacrificial epitaxial layer is deposited on the frontside only. In one embodiment, $Ge_xSi_{1-x}$ is used for the sacrificial epitaxial layer and is between 10 and 2000 nanometers (in another embodiment a layer of porous silicon is directly deposited for the sacrificial layer). Next, a doped monocrystalline silicon epitaxial layer is deposited (in one embodiment, on the frontside only). In one embodiment, the layer is p-type, boron-doped and has a thickness between 1 and 30 microns. Step 406 involves selective silicon etch to selectively strip the top silicon layer, stopping on the sacrificial layer. First, the top silicon layer is removed using a selective (wet or dry) silicon etch process until the top $Ge_xSi_{1-x}$ epitaxial layer (or porous silicon) or oxide/nitride hard mask is exposed. When using a plasma (dry) etch process, one embodiment uses optical end-point detection to ensure complete removal of the top silicon layer and exposure of the top sacrificial ($Ge_xSi_{1-x}$ or porous silicon) layer. Step 1908 involves 3-D TFSS substrate release using a selective etchant to etch the sacrificial layer. A highly selective isotropic (in one embodiment, wet) etch of $Ge_xSi_{1-x}$ is performed, with very high selectivity with respect to silicon (in one embodiment, with etch selectivity much better than 100:1). In one embodiment, a mixture of hydrofluoric acid, nitric acid and acetic acid (HNA) is used to etch the sacrificial $Ge_xSi_{1-x}$ layer (etchants such as $H_2O_2+H_2O$ or TMAH may be used to selectively etch porous silicon). Alternatively, a mixture of ammonia, peroxide, and water ($NH_4OH+H_2O_2+H_2O$) may be used. In another embodiment, the 3-D TFSS substrate may be released by the methods of the present disclosure. This process releases the crystalline silicon layer as a hexagonal-prism 3-D TFSS substrate, which may then be used for subsequent 3-D TFSS fabrication.

Figure 19:
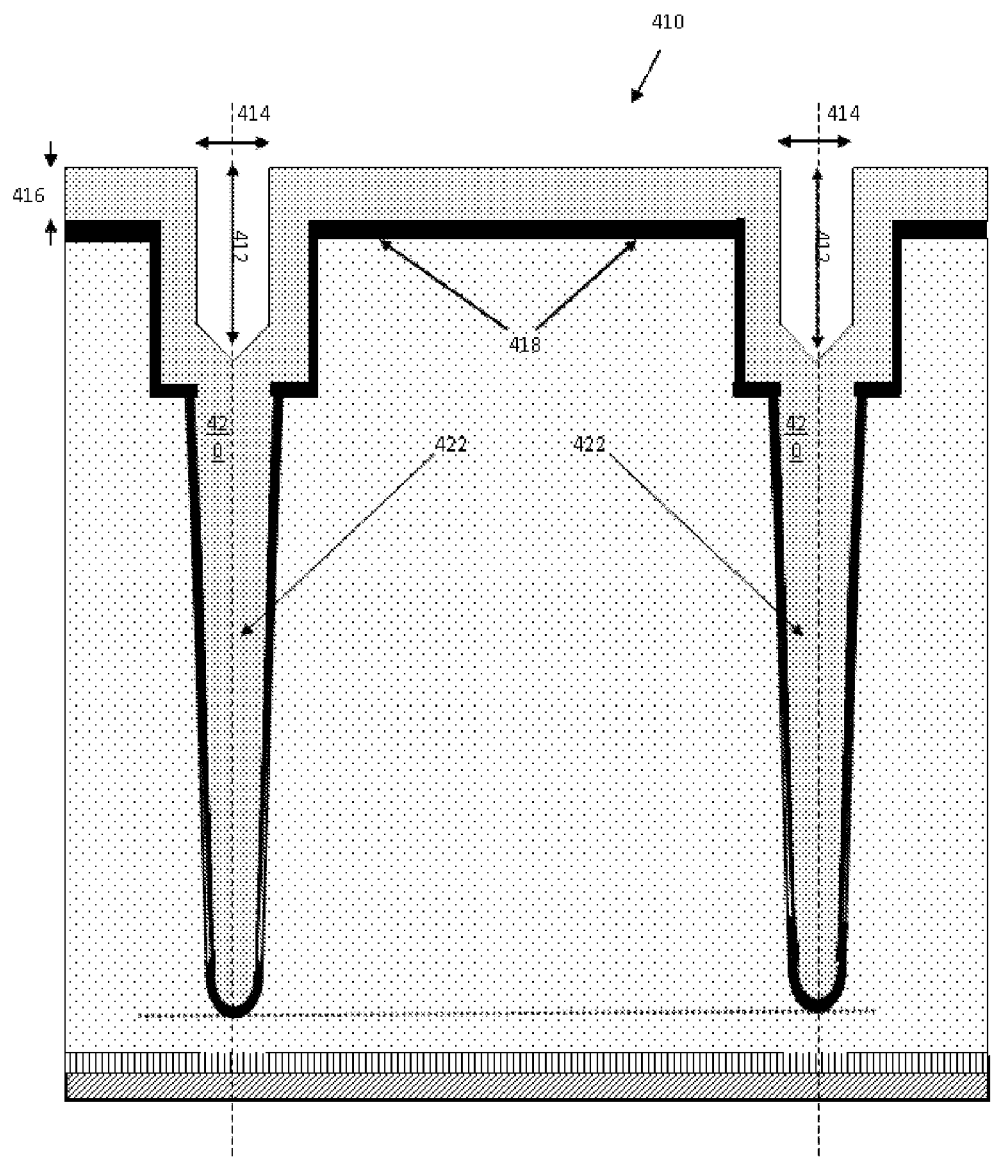

FIG. 19 shows a view 410 after deposition of the thin (e.g., 200 to 2000 nanometers thick) sacrificial layer 418 (epitaxial $Ge_xSi_{1-x}$ or porous silicon or another suitable material) and the in-situ-doped (boron-doped for p-type base) epitaxial silicon layer 420. The epitaxial silicon deposition process fills the trenches (void-free trench fill) while leaving relatively shallow troughs (trenches 422) near the top. This may be done by stopping the epitaxial deposition process after the deeper/narrower trenches are fully filled with epitaxial silicon and before filling of the wider/shallower trenches on the template frontside (thus, forming the shallower troughs with height (L) 412 and width ($W_m$) 414 in conjunction with the top epitaxial silicon layer of thickness ($W_f$) 416.

Figure 20:
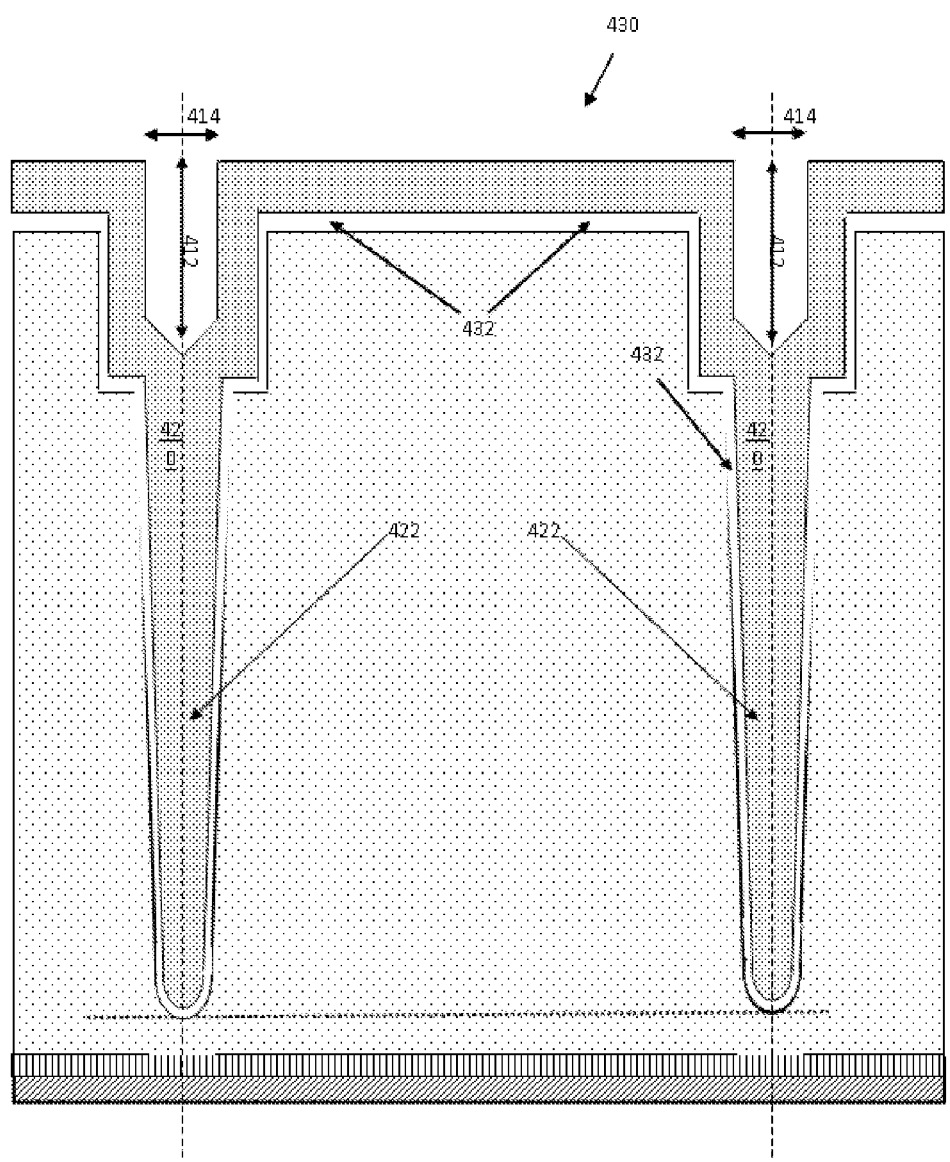

FIG. 20 shows a view 430 of the template in FIG. 19 after highly selective etching of the sacrificial layer 418, thus allowing for release and removal of the 3-D TFSS substrate 420 from the template. The porous silicon layer may also be selectively etched using the methods of the present disclosure.

Figure 21:
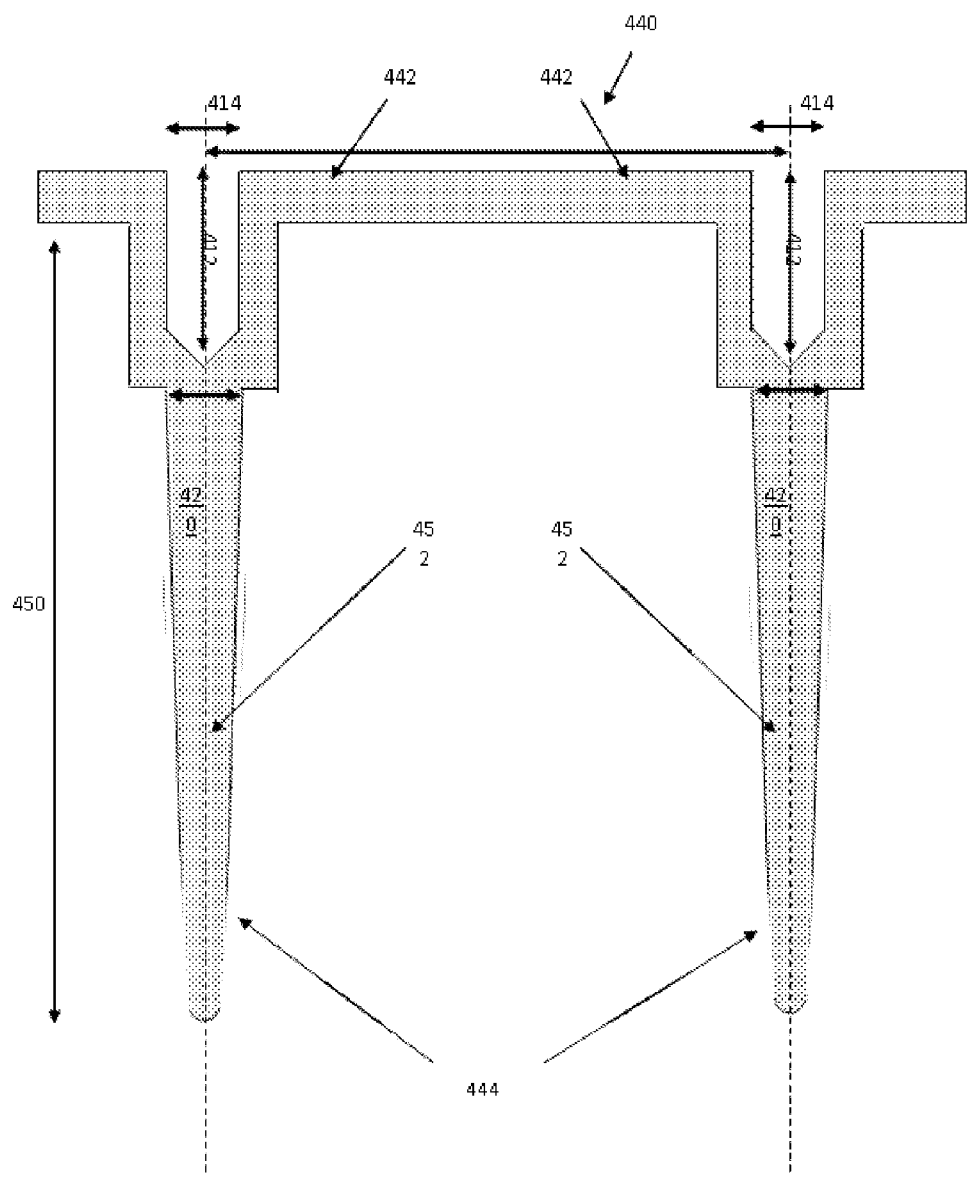
Figure 22:
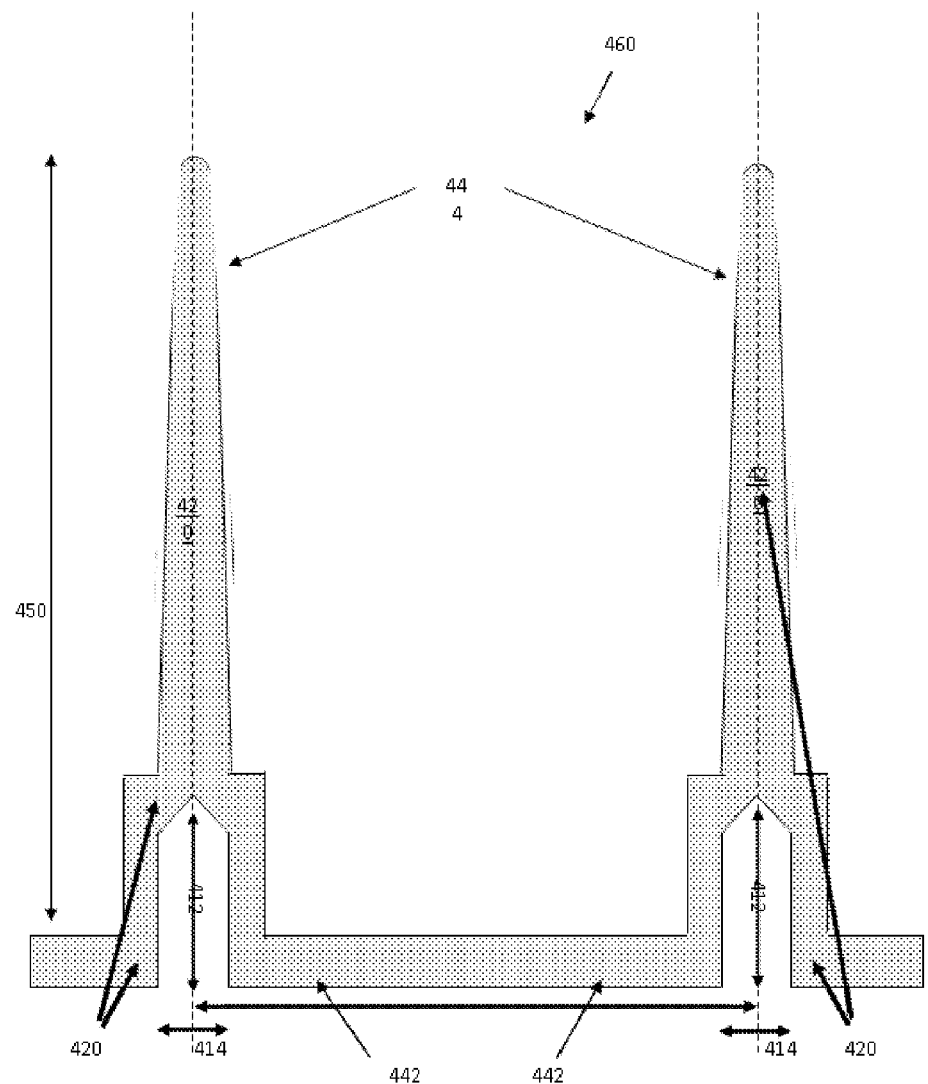
Figure 23:
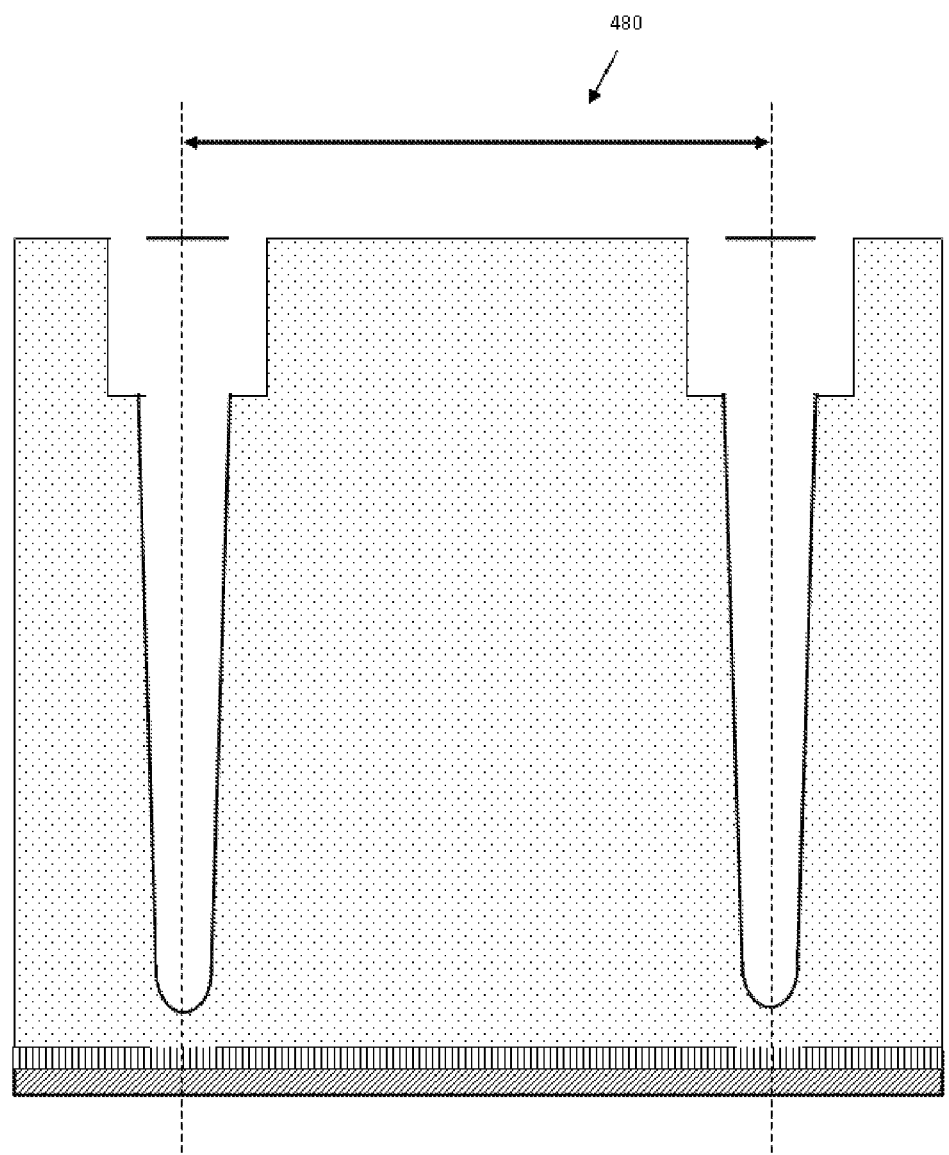

FIGS. 21 and 23 illustrate Y-Y cross-sectional views 440 and 480 of the released substrate 420 from FIG. 20. The released substrate 420 has a base side 442, an emitter side 444. The substrate 420 has dimensions of $T_{st}$ (silicon sidewall thickness near the base side of the hexagonal-prism vertical sidewalls), $T_{sb}$ (silicon sidewall thickness near the emitter side of the hexagonal-prism vertical sidewalls), hexagonal-prism height 450, and tapered hexagonal-prism TFSS substrate sidewalls 452. Referring to the view 460 in FIG. 21, the base side 442 is shown on the top and the emitter side 444 is shown on the bottom (TFSS substrate as released from the template). In the view 460 in FIG. 22, the base side 442 is shown on the bottom and the emitter side 444 is shown on the top. FIG. 23 shows a Y-Y cross-sectional view 480 of the template shown in FIG. 21 after releasing and separating/removing the embedded hexagonal-prism single-aperture 3-D TFSS substrate with a rear base layer. Template 480 is ready for multiple reuse cycles.

FIG. 24A shows a Y-Y cross-sectional view 510 of a unit cell within a single-aperture hexagonal-prism 3-D TFSS substrate with a rear base layer (released and removed from its template) before cell fabrication. For subsequent $n^+p$ selective emitter formation, the hexagonal-prism sidewalls are in-situ-doped with boron to form the base region at the time of 3-D TFSS substrate fabrication. The sidewalls are doped with boron (in one embodiment, at the time of silicon deposition into the template), either uniformly or in a graded profile, more lightly doped at the prism sidewall surface and more heavily doped towards the sidewall vertical center axis. Similarly, the hexagonal-prism rear base layer is in-situ-doped at the time of 3-D TFSS substrate fabrication. The base layer is doped with boron, either uniformly or in a graded profile, more lightly doped at the rear base layer top surface and more heavily doped towards the rear base layer rear surface, creating a built-in back-surface-field effect in the rear base layer, improving the cell performance. The prism top (emitter side) ridges 512 are used for emitter contact diffusion and metal contact formation and the hexagonal troughs 494 for base contact diffusion and buried metal contact formation.

FIG. 24B shows a Y-Y cross-sectional view 520 of a unit cell within the hexagonal prism 3-D TFSS of this disclosure (using the hexagonal prism 3-D TFSS substrate with a rear base layer as shown in FIG. 24A) after self-aligned formation of: selective emitter regions 502 (e.g., less heavily-doped with phosphorus, $n^+$ selective emitter on the hexagonal prism sidewall surfaces as shown); heavily-doped emitter contact regions 504 with coverage height $L_e$ 506 (e.g., more heavily-doped with phosphorus, $n^{++}$ doped emitter contact regions on the hexagonal prism top hexagonal ridges as shown); selective base regions 508 on the rear surface of the rear base layer (e.g., less heavily-doped with boron, $p^+$ selective base on the rear base layer rear surface as shown); and heavily-doped (boron-doped $p^{++}$) base contact diffusion regions 510 in the rear base layer trenches/troughs (e.g., more heavily-doped with boron, $p^{++}$ doped base contact regions). The cured solid dopant source layers for emitter 505 and base regions 512 are shown as dark segments on the top hexagonal-prism ridges and within the rear base rear filled trenches (troughs), respectively.

Figures 25A, 25B:
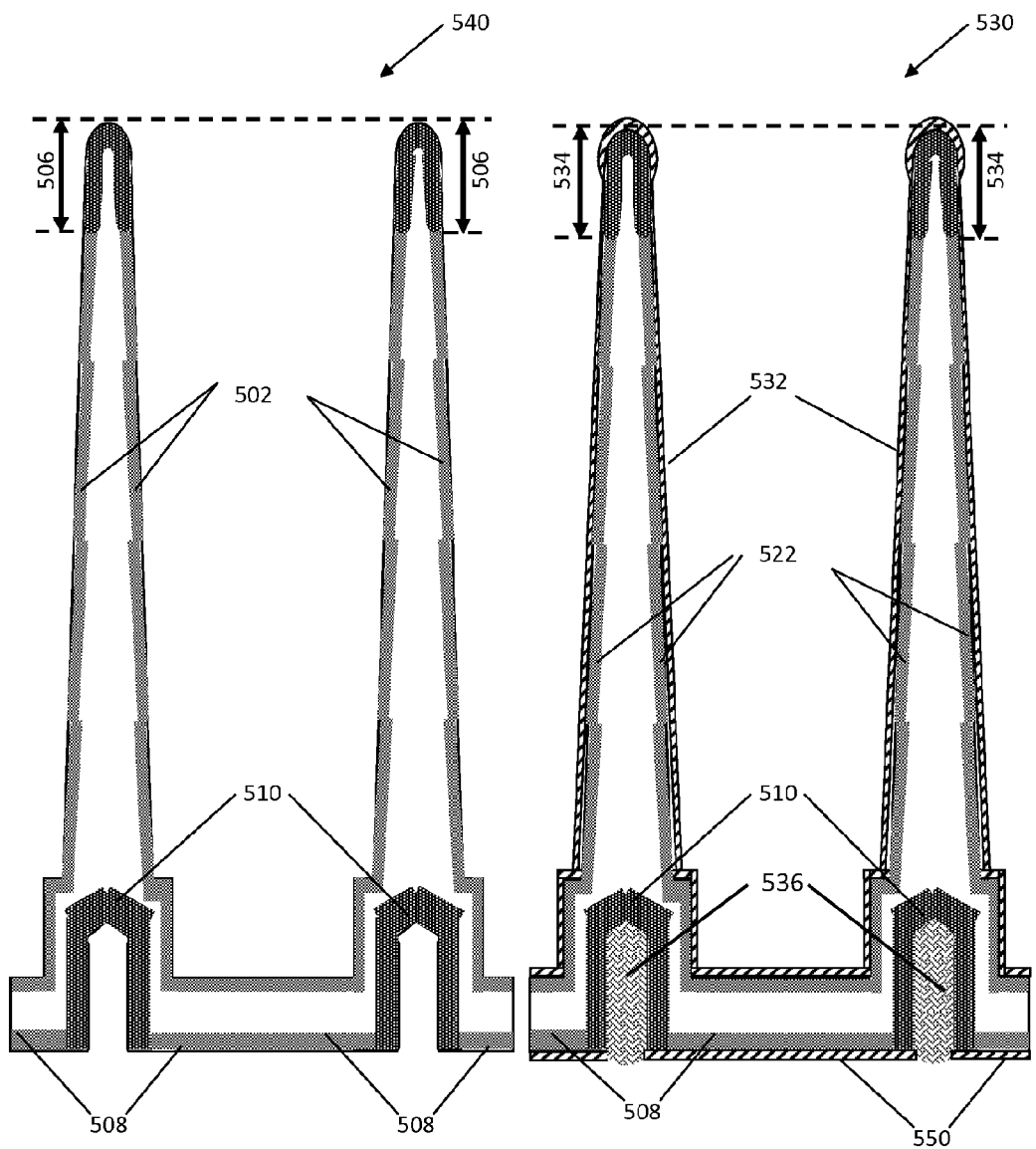
Figure 26A:
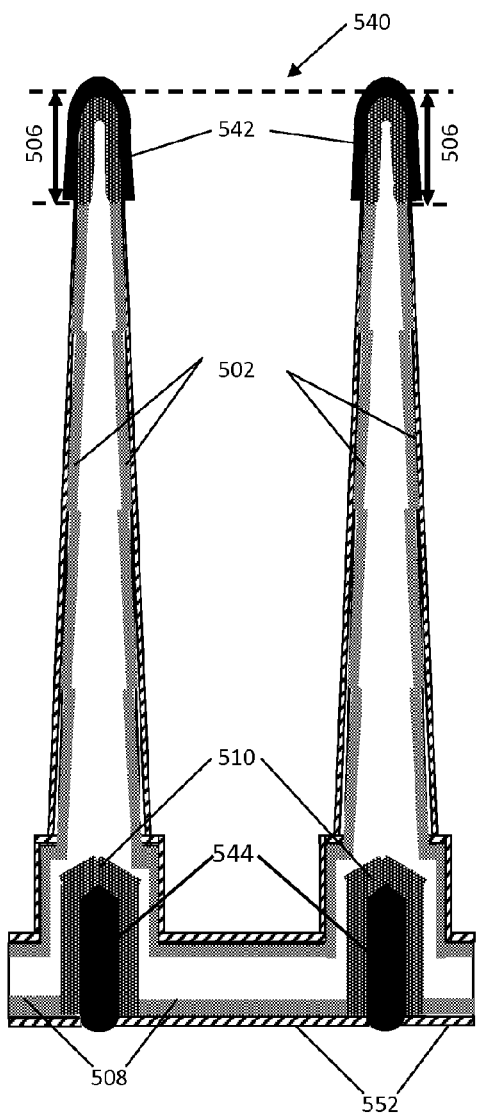
Figure 26B:
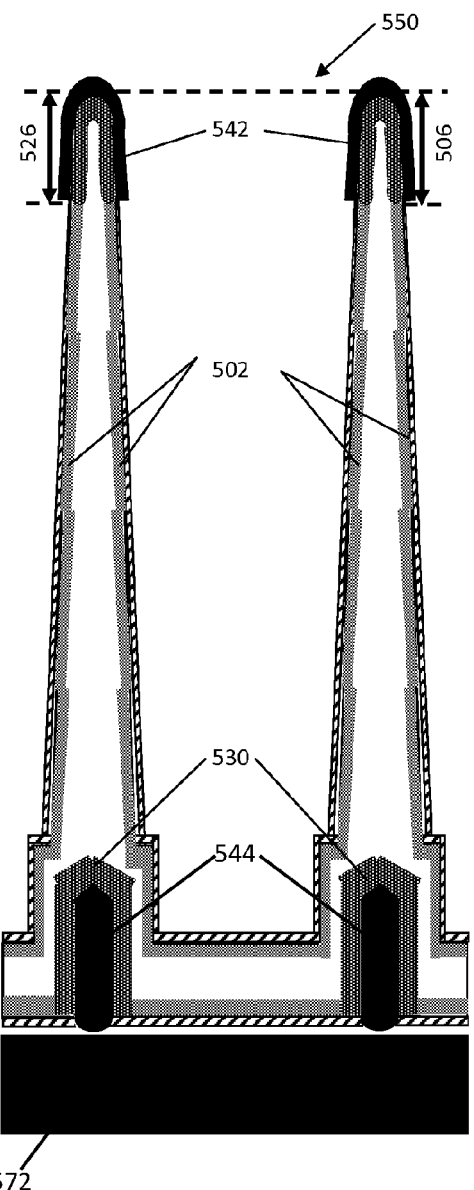

FIG. 25A shows a Y-Y cross-sectional view 520 after the cured n-type and p-type dopant layers have been removed and before the thermal diffusion process. FIG. 25B shows a Y-Y cross-sectional view 530 after formation of surface passivation and anti-reflection coating (thermal $SiO_2$ and/or PVD or PECVD $SiN_x$ or $AlN_x$ ARC) dielectric layers 532. Note $L_e$ 534 and cured boron doped glass 536. FIG. 26A shows a Y-Y cross-sectional view 540 after formation of emitter 542 and base 544 contact metals (silver, aluminum, copper, etc.) by fire-through and/or selective plating. FIG. 26B shows a Y-Y cross-sectional view 550 after the addition of a detached highly reflective rear specular or diffuse mirror 552 (e.g., silver or aluminum coating on a base interconnect plane on a PCB in the solar module assembly; the mirror may contact the rear base contacts as shown).

FIG. 27 shows a view 560 of a template with hexagonal-prism posts (pillars) 562. A hexagonal-prism 3-D TFSS substrate (not shown) is fabricated by first forming a suitable relatively conformal thin sacrificial layer (in one embodiment, porous silicon) on the template, then filling in the relatively deep trenches 564 between hexagonal-prism posts 562, and subsequently releasing the hexagonal prism 3-D TFSS substrate by selectively etching or fracturing the sacrificial layer (not shown) deposited between the hexagonal-prism 3-D TFSS substrate and the template. In one embodiment, the template has deep interconnected hexagonal-prism trenches with slightly tapered sidewalls (i.e., larger trench widths near the top of the trenched compared to near the bottom of the trenches. Moreover, the trench widths near the top of the trenches may be made about one to several microns larger than the trench widths near the bottom of the trenches.

FIG. 28 shows a view 570 of a template with hexagonal-prism posts (pillars) 572. A hexagonal-prism 3-D TFSS substrate (not shown) is fabricated by first forming a suitable relatively conformal thin sacrificial layer (in one embodiment, porous silicon) on the template, then filling in the relatively deep trenches 574 between hexagonal-prism posts 572, and subsequently releasing the hexagonal prism 3-D TFSS substrate by selectively etching or fracturing the sacrificial layer (not shown) deposited between the hexagonal-prism 3-D TFSS substrate and the template. In one embodiment, the template has deep interconnected hexagonal-prism trenches with slightly tapered sidewalls (i.e., larger trench widths near the top of the trenched compared to near the bottom of the trenches. Moreover, the trench widths near the top of the trenches may be made about one to several microns larger than the trench widths near the bottom of the trenches.

FIG. 29 shows a 3-D view 580 of multiple adjacent prism unit cells from a regular hexagonal prism TFSS of this disclosure, after cell fabrication, including self-aligned base and emitter contact metallization. The dark region on the top 582 of the unit cell is the self-aligned emitter contact metal; the rear 584 of the unit cell is the self-aligned base contact metal. The prism sidewall surfaces are doped to form the selective emitter junctions (e.g., shallow $n^+p$ junctions with a junction depth of 0.2 to 0.5 micron in boron-doped silicon base).

FIG. 30A shows a quasi 3-D view 590 of a single unit cell from a regular dual-aperture hexagonal-prism TFSS of this disclosure (shown for the cell without a rear base layer), before self-aligned base and emitter contact metallization. The prism sidewall surfaces are doped to form the selective emitter junctions (e.g., $n^+p$ junctions in boron-doped silicon base). FIG. 30A shows top hexagonal opening 594, which may form the frontside self-aligned emitter metallization contacts 592; and rear (bottom) hexagonal opening 596, which may form the rear selective base self-aligned contacts 594.

FIG. 30B shows a quasi 3-D view 600 of a single unit cell from a regular hexagonal prism TFSS of this disclosure, after cell fabrication, including self-aligned base and emitter contact metallization. The dark region on the top of the unit cell is the self-aligned emitter contact metal 602; the rear of the unit cell is the self-aligned base contact metal 606. The prism sidewall surfaces are doped to form the selective emitter junctions (e.g., shallow $n^+p$ junctions with a junction depth of 0.2 to 0.5 micron in boron-doped silicon base). One embodiment of the present disclosure utilizes a screen printing material having mesh openings less than 10 um in diameter. The mesh openings must be smaller than the openings of the micro cavities on the 3-D substrate or capillary forces generated by the micro cavities on the 3-D substrate will pull the liquid coating material in. Alternatively, a continuous flexible thin sheet that has a rough surface may be used as a screen printing material.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A method for fabrication of a thin-film crystalline semiconductor substrate by releasing it from a semiconductor template through the use of a sacrificial porous semiconductor seed and release layer, the method comprising:
    forming a porous semiconductor layer on a semiconductor template measuring at least 200 mm×200 mm, said porous semiconductor layer substantially conformal to said semiconductor template;
    forming a thin-film crystalline semiconductor substrate on said porous semiconductor layer, said thin-film semiconductor substrate substantially conformal to said porous semiconductor layer; and
    selectively and chemically wet etching said porous semiconductor layer with a high-etch-selectivity wet etchant, said wet etchant solution comprising dilute TMAH or KOH or NaOH;
    releasing said thin-film semiconductor substrate as a free-standing, self-supporting semiconductor substrate from said semiconductor template via selective wet etching of said porous semiconductor layer.

2. The method of claim 1, wherein said step of selectively etching said porous semiconductor layer further comprises degassing said etchant prior to said selective etching step.

3. The method of claim 1, wherein said step of selectively etching said porous semiconductor layer further comprises degassing said etchant during said selective etching step.

4. The method of claim 1, wherein said step of selectively etching said porous semiconductor layer occurs in a vacuum chamber.

5. The method of claim 1, wherein said step of selectively etching said porous semiconductor layer further comprises ultrasonically streaming said etchant at said porous semiconductor layer.

6. The method of claim 1, wherein said step of selectively etching said porous semiconductor layer further comprises megasonically streaming said etchant at said porous semiconductor layer.

7. The method of claim 1, wherein said step of selectively etching said porous semiconductor layer further comprises directing acoustic waves at said porous semiconductor layer.

8. The method of claim 7, wherein said acoustic waves comprise acoustic waves having a plurality of frequencies.

9. The method of claim 1, wherein said step of forming a porous semiconductor layer further comprises the step of forming a porous semiconductor bi-layer comprising a low porosity layer with a porosity in the range of 15% to 30% and a high porosity layer with a porosity in the range of 60% to 85%.

10. The method of claim 9, wherein said step of selectively etching said porous semiconductor layer further comprises mechanically delaminating said high porosity silicon layer using low frequency ultrasonic energy.

11. The method of claim 1, wherein said step of forming a porous semiconductor layer further comprises the step of forming a porous silicon layer.

12. The method of claim 11, wherein said etchant comprises a tetramethylammonium hydroxide (TMAH) solution.

13. The method of claim 11, wherein said etchant comprises a tetramethylammonium hydroxide (TMAH) and ammonium persulfate crystalline additive solution.

14. The method of claim 11, wherein said etchant comprises a potassium hydroxide (KOH) solution.

15. The method of claim 11, wherein said etchant comprises a potassium hydroxide (KOH) and hydrofluoric (HF) acid solution.

16. The method of claim 11, wherein said etchant comprises a potassium hydroxide (KOH) and isopropyl alcohol (IPA) solution.

17. The method of claim 11, wherein said etchant comprises a potassium hydroxide (KOH) and surfactant solution.

18. The method of claim 11, wherein said etchant comprises a potassium hydroxide (KOH), hydrofluoric (HF) acid, and surfactant solution.

19. The method of claim 1, wherein said step of forming a thin-film semiconductor substrate further comprises the step of forming a thin-film silicon substrate having three-dimensional features.

20. The method of claim 1, wherein said step of forming a porous semiconductor layer on a semiconductor template further comprises the step of forming a porous semiconductor layer on a silicon template having three-dimensional features.

* * * * *